United States Patent
Murphy et al.

(10) Patent No.: US 12,411,412 B2
(45) Date of Patent: Sep. 9, 2025

(54) PATTERNING SEMICONDUCTOR FEATURES

(71) Applicant: Tokyo Electron Limited, Tokyo (JP)

(72) Inventors: Michael Murphy, Albany, NY (US); Charlotte Cutler, Albany, NY (US); David Conklin, Saratoga Springs, NY (US)

(73) Assignee: Toyko Electron Limited, Tokyo (JP)

( * ) Notice: Subject to any disclaimer, the term of this patent is extended or adjusted under 35 U.S.C. 154(b) by 561 days.

(21) Appl. No.: 17/992,522

(22) Filed: Nov. 22, 2022

(65) Prior Publication Data
US 2024/0168384 A1 May 23, 2024

(51) Int. Cl.
G03F 7/16 (2006.01)
G03F 7/00 (2006.01)
G03F 7/30 (2006.01)
G03F 7/38 (2006.01)
G03F 7/40 (2006.01)

(52) U.S. Cl.
CPC ............ G03F 7/168 (2013.01); G03F 7/0035 (2013.01); G03F 7/30 (2013.01); G03F 7/38 (2013.01); G03F 7/40 (2013.01)

(58) Field of Classification Search
CPC . G03F 7/11; G03F 7/0035; G03F 7/38; G03F 7/40; G03F 7/30
See application file for complete search history.

(56) References Cited

U.S. PATENT DOCUMENTS 8,900,797 B2   12/2014  Nakasugi et al.
2007/0077524 A1*  4/2007  Koh .................... H01L 21/0338
                                                       257/E21.026
2009/0142711 A1   6/2009  Jung et al.
(Continued)

FOREIGN PATENT DOCUMENTS

WO     2015157416 A1    10/2015

OTHER PUBLICATIONS

PCT International Search Report and Written Opinion of the International Searching Authority, PCT/US2023/037212, dated Mar. 12, 2024, 9 pages.
(Continued)

*Primary Examiner* — Brittany L Raymond
(74) *Attorney, Agent, or Firm* — Slater Matsil, LLP

(57) ABSTRACT

In certain embodiments, a method includes forming, by photolithography on a semiconductor wafer, first patterned features (PFs) including first photoresist structures (PRSs) having a first width and first recesses having a second width less than the first width and greater than a target width; forming, via anti-spacer patterning processing, second PFs including second PRSs having a third width less than the first width, first overcoat structures (OCSs) of the second width interspersed between second PRSs, and second recesses having a fourth width less than the target width; and forming, via acid diffusion processing, third PFs including third PRSs having a fifth width, second OCSs of the target width interspersed between third PRSs, and third recesses defined by third PRSs and second OCSs and having a sixth width greater than the fourth width, portions of first OCSs having been selectively removed using the acid diffusion processing to form second OCSs.

21 Claims, 16 Drawing Sheets

(56) References Cited

U.S. PATENT DOCUMENTS

| | | | |
|---|---|---|---|
| 2010/0130016 A1* | 5/2010 | DeVilliers | H01L 21/32139 |
| | | | 438/703 |
| 2011/0027993 A1* | 2/2011 | Moon | G03F 7/40 |
| | | | 438/689 |
| 2013/0171574 A1 | 7/2013 | Xu | |
| 2016/0181115 A1* | 6/2016 | deVilliers | H01L 21/32139 |
| | | | 438/695 |

OTHER PUBLICATIONS

Bencher et al., "22nm Half-Pitch Patterning by CVD Spacer Self Alignment Double Patterning (SADP)," Proceedings of SPIE—The International Society for Optical Engineering, Proc. of SPIE vol. 6924, Mar. 2008, 8 pages.

Hyatt et al., "Anti-spacer double patterning," SPIE Advanced Lithography, Proc. of SPIE vol. 905, Mar. 27, 2014, SPIEDigitalLibrary.org/conference-proceedings-of-spie, San Jose, California, United States, 10 pages.

Nakamura et al., "Process feasibility investigation of freezing free litho-litho-etch process for below 32nm hp," Advances in Resist Materials and Processing Technology XXVII, Proc. of SPIE vol. 7639, SPIE Advanced Lithography, Mar. 25, 2010, SPIEDigitalLibrary.org/conference-proceedings-of-spie, San Jose, California, United States, 9 pages.

Nakamura et al., "Process Feasibility Investigation of Freezing Free Process," Journal of Photopolymer Science and Technology, vol. 22, No. 5, Jun. 8, 2009, 6 pages.

Sakamoto et al., "Bottom-Anti-Reflective coatings (BARC) for LFLE Double patterning process," Proceedings of SPIE—The International Society for Optical Engineering, Proc. of SPIE vol. 7520, Dec. 2009, 11 pages.

* cited by examiner

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

CROSS-SECTIONAL VIEW

PLAN VIEW

PLAN VIEW

PATTERNING SEMICONDUCTOR FEATURES

TECHNICAL FIELD

This disclosure relates generally to semiconductor fabrication, and, in particular embodiments, to patterning semiconductor features.

BACKGROUND

Semiconductor devices typically are fabricated by sequentially depositing insulating or dielectric layers, conductive layers, and other layers of material over a semiconductor substrate, and patterning the layers using lithography to form circuit components and elements on the substrate. The semiconductor industry continues to increase the density of electronic components (e.g., transistors, diodes, resistors, capacitors, etc.) by continual reductions in minimum feature size, allowing more components to be integrated into a particular area.

SUMMARY

In certain embodiments, a method includes depositing a first overcoat film on a semiconductor wafer that includes first patterned features of a photoresist layer, the first patterned features include first photoresist structures and first recesses defined by the first photoresist structures. The first overcoat film fills the first recesses and covers the first photoresist structures. The first recesses have first widths that are greater than a target width. The method includes baking the semiconductor wafer to form soluble portions of the first photoresist structures, selectively removing the first overcoat film, and depositing a second overcoat film that fills the first recesses and covers the first photoresist structures. The method includes developing the semiconductor wafer to remove portions of the second overcoat film to reveal and remove the soluble portions of the first photoresist structures to define second patterned features that include second photoresist structures, first overcoat structures interspersed between the second photoresist structures, and second recesses defined by the second photoresist structures and the first overcoat structures. The method includes executing a solubility-changing process to cause the first overcoat structures to become insoluble for development, depositing a third overcoat film that fills the second recesses and covers the second photoresist structures and the first overcoat structures, and baking the semiconductor wafer to form soluble portions of the first overcoat structures. The method includes developing the semiconductor wafer to remove the third overcoat film and the soluble portions of the first overcoat structures to define third patterned features that include third photoresist structures, second overcoat structures interspersed between the third photoresist structures, and third recesses defined by the second overcoat structures and the third photoresist structures. The second overcoat structures have the target width.

In certain embodiments, a method includes forming, on a semiconductor wafer by photolithography, first photoresist structures having a first width and first recesses defined by the first photoresist structures and having a second width less than the first width and greater than a target width. The method includes depositing a first overcoat film; forming, using the first overcoat film, soluble portions of the first photoresist structures; selectively removing the first overcoat film; and depositing a second overcoat film. The method includes removing portions of the second overcoat film and the soluble portions of the first photoresist structures to define second photoresist structures, first overcoat structures of the second overcoat film, and second recesses in regions previously occupied by the soluble portions of the first photoresist structures. The second photoresist structures have a third width less than the first width, the first overcoat structures have the second width, and the second recesses have a fourth width less than the target width. The method includes modifying the first overcoat structures to become insoluble for development; depositing a third overcoat film; forming, using the third overcoat film, soluble portions of the first overcoat structures; and selectively removing the third overcoat film and the soluble portions of the first overcoat structures to define third photoresist structures having a fifth width, second overcoat structures interspersed between the third photoresist structures and having a sixth width equal to the target width, and third recesses defined by the third photoresist structures and the second overcoat structures and having a seventh width greater than the fourth width.

In certain embodiments, a method includes forming, by photolithography on a semiconductor wafer, first patterned features including first photoresist structures having a first width and first recesses defined by the first photoresist structures and having a second width less than the first width and greater than a target width. The method includes forming, using an anti-spacer patterning process, second patterned features including second photoresist structures having a third width less than the first width, first overcoat structures interspersed between the second photoresist structures and having the second width, and second recesses defined by the second photoresist structures and the first overcoat structures and having a fourth width less than the target width. The method includes forming, using an acid diffusion process, third patterned features that include third photoresist structures having a fifth width, second overcoat structures interspersed between the third photoresist structures and having the target width, and third recesses defined by the third photoresist structures and the second overcoat structures and having a sixth width greater than the fourth width, portions of the first overcoat structures having been selectively removed using the acid diffusion process to form the second overcoat structures.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1A:
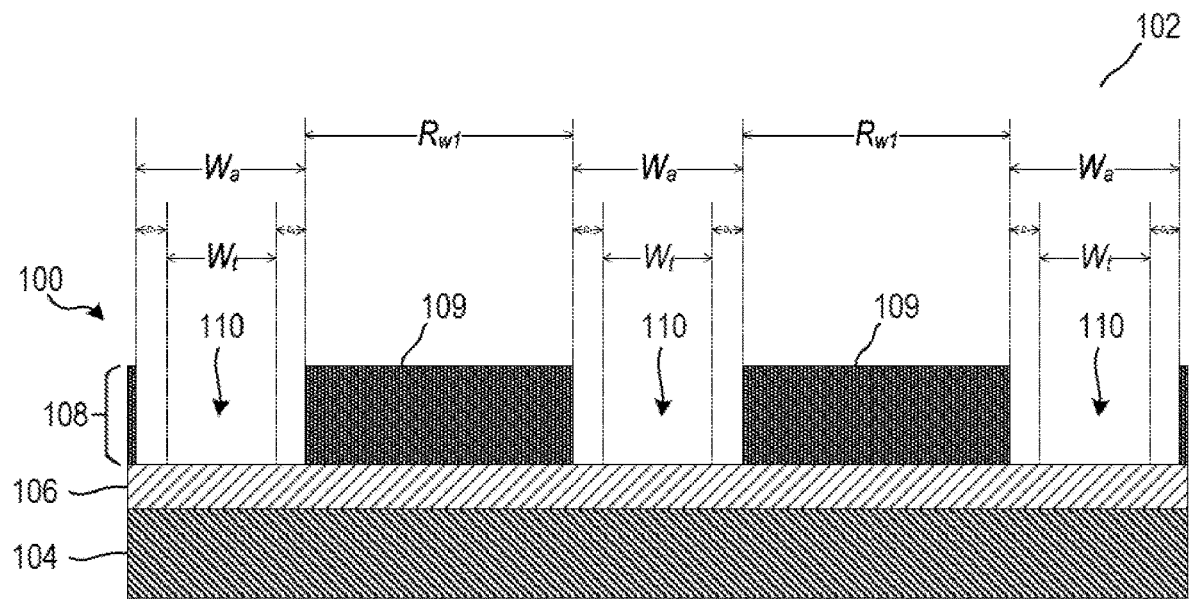
FIGS. 1A-1K illustrate cross-sectional and plan views of an example semiconductor workpiece during an example patterning process, according to certain embodiments.
Figure 1A:
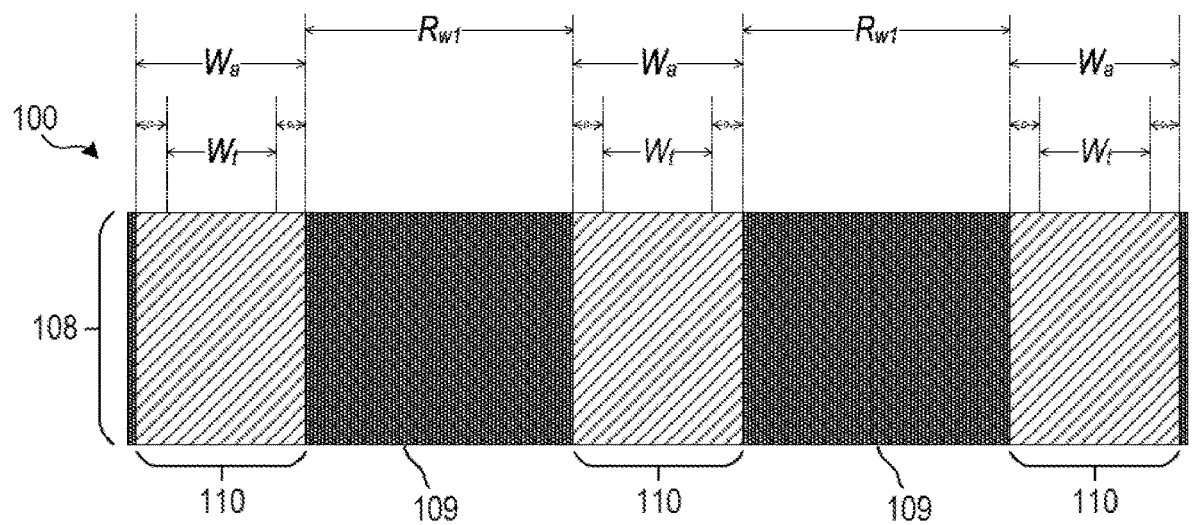

As described above, as semiconductor devices have continued to shrink, the dimensions of features formed on a semiconductor substrate also have decreased while a density of those features within smaller areas has increased. With this reduction in feature size and increase in density, difficulties associated with patterning at or below photolithography limits has grown.

The minimum feature size (including patterned structures and recesses defined by those patterned structures) that may be directly achievable using a photolithography technology may be determined according to a photolithography technology used to pattern the features (e.g., in a photoresist layer that may be used to transfer the pattern to one or more underlying layers). For example, different photolithography technologies may use different wavelengths of radiation to deliver actinic radiation to a target layer (e.g., to a photoresist layer to be patterned using photolithography). The wavelength of radiation may affect the minimum feature size achievable during photolithography patterning. In general, the smaller the feature size that is attainable, the more advanced and expensive the lithography equipment for achieving that features size. For example, some newer technologies, such as extreme ultraviolet (EUV) lithography, are able to directly achieve relatively small feature sizes, approaching a 13 nanometer (nm) half pitch using EUV 13.5 nm wavelength at 0.33 numerical aperture (NA). However, these newer technologies may suffer certain drawbacks, including expense.

Some older lithography technologies, such as 193 nm dry photolithography, 193 nm immersion photolithography, i-line photolithography, and others, remain commonly used and may be used in combination with other processes to achieve smaller features sizes than may be achieved directly using the older photolithography technology. That is, certain techniques may be used to allow certain feature sizes to be achieved that go beyond the feature sizes that may be directly achieved using a particular lithography technology. Such smaller features may be referred to as sub-resolution features.

Various multi-patterning technologies may be used to attempt to meet these demands, including self-aligned double-patterning (SADP), litho-etch-litho-etch (LELE), litho-freeze-litho-etch (LFLE), and self-aligned block (SAB). Self-aligned patterning schemes such as SADP may facilitate forming sub-resolution features at a fraction of the original pitch while minimizing edge placement error. SADP processes, however, may rely on depositing and etching inorganic spacers such as amorphous silicon or silicon nitride to resolve final features. Such processes may reduce throughput while increasing cost and complexity of integration to maximize pattern fidelity and etch selectivity.

Another example SADP technique that may be used to achieve sub-resolution features is an anti-spacer patterning process that may use spin-on organic films and diffusion of reactive species (e.g., acid) relative to a photoresist structure (e.g., a mandrel) to form sub-resolution trenches with relatively high throughput and low cost. Anti-spacer process flows use the reactive nature of photoresists to be either the diffuser or reactant of a reactive species across an overcoat-photoresist boundary in which the diffusion length and reaction within said volume may determine the critical dimension (CD) of a patterned feature.

In an example anti-spacer flow, a reactive species may diffuse from a first overcoat into a patterned photoresist structure (e.g., mandrel) causing deprotection of the patterned photoresist feature to a specified depth. The first overcoat may be selectively removed and replaced with a second overcoat. The second overcoat may be designed to controllably recess during a development process to expose the deprotected patterned photoresist feature and resolve narrow trenches with CDs controlled by the depth of diffusion that occurred with the first overcoat. The spin-on nature of the overcoats and relatively short bake times for diffusion of the reactive species into the patterned photoresist structures may provide an overall patterning process with high throughput and low relative cost. However, such a patterning process that involves diffusion of a reactive species into a photoresist structure may be limited with respect to the final pitch of the narrow trench features.

Among the characteristics of a pattern formed using a lithographic patterning process is feature pitch. Feature pitch may refer to the length of a repeat pattern of patterned features. As just one example, if the patterned features include a line-space-line-space pattern, a pitch may include a combination of the widths of a line and an adjacent space. Along with other pattern characteristics, the feature pitch indicates the density of features that can be achieved using the patterning process, and in general, a smaller pitch is desired as a smaller pitch may allow more features to be formed in a smaller area. Furthermore, in some implementations, having a consistent, repeatable pitch may be appropriate. Such a pitch may include a feature pitch ratio of, for example, 1:1:1:1 for a line-space-line-space pattern.

Using the above-described anti-spacer flow, the feature pitch may be limited by the narrowest recess (e.g., trench) that may be lithographically formed between dense lines. Taking an example in which a 193 nm dry photolithography technology is used to pattern a photoresist layer on a semiconductor wafer, and with a goal to form a 45 nm 1:1 dense line-space pattern, 193 nm dry photolithography exposure tools may be unable to directly pattern a photoresist pattern of 135 nm line and 45 nm trench to form a 45 nm 1:1 line-space pattern. In other words, a 193 nm dry photolithography exposure may be unable to form 3:1 line-space ratio of 135 nm:45 nm that would be appropriate to achieve a final 45 nm 1:1 line-space target. Instead, the 193 nm dry photolithography tool might more realistically be used to pattern at a 180 nm pitch in which a 110 nm line and a 70 nm trench are formed. However, using the above-described anti-spacer process to reduce the 70 nm trench to a 45 nm anti-spacer trench may result in a non-uniform asymmetrical final pitch of, potentially, 70 nm:45 nm:20 nm:45 nm line-space-line-space pattern, which may be undesirable for particular applications, many of which target pitch patterns approaching or achieving a 1:1:1:1 pitch pattern.

Certain embodiments of this disclosure provide techniques for achieving sub-resolution features while reducing or minimizing feature pitch ratio. In certain embodiments, a feature pitch ratio of 1:1:1:1 for a line-space-line-space feature pattern may be achieved. Certain embodiments accomplish this by widening the anti-spacer (trench/recess) CD post-anti-spacer reveal to achieve, potentially, a more similar or even same CD across the lines and spaces.

For example, certain embodiments include forming, using photolithography, first patterned features on a semiconductor wafer. The first patterned features include first photoresist structures (e.g., lines) having first widths and first recesses (e.g., trenches/spaces) defined by the first photoresist structures and having second widths. Due at least in part to limitations of the photolithography technology, the second widths are greater than a target width. Additionally, a pitch ratio is greater than a target pitch ratio.

Continuing, using an anti-spacer process, second patterned features are formed on the semiconductor wafer. The second patterned features include second photoresist structures (formed by solubilizing and removing, as part of the anti-spacer process, portions of the first photoresist structures), first overcoat structures formed in spaces where the first recesses were previously located, and second recesses formed in spaces where portions of the first photoresist structures were removed (the anti-spacers). While the second photoresist structures might or might not have a target width at this stage, the first overcoat structures may be wider than a target width and the second recesses may be narrower than a target width. Additionally, a pitch ratio is greater than a target pitch ratio.

Continuing, using an acid diffusion process, third patterned features are formed on the semiconductor wafer. The third patterned features include third photoresist structures (which might or might not have the same width as the second photoresist structures), second overcoat structures formed by removing (via the acid diffusion process) portions of the first overcoat structures, and third recesses that have been widened due to the removal of portions of the first overcoat structures. In certain embodiments, at this stage, the third patterned features each have respective target widths, which might be the same target widths. Additionally, a pitch ratio may be a target pitch ratio, which in one example is a 1:1:1:1 line(third overcoat structure)-space(third recess)-line(second overcoat structure)-space(third recess) pitch ratio.

FIGS. 1A-1K illustrate cross-sectional and plan views of an example semiconductor workpiece 100 during an example patterning process 102, according to certain embodiments. In certain embodiments, some or all of patterning process 102 may be referred to as an anti-spacer process. In certain embodiments, patterning process 102 may be used to achieve sub-resolution features in an underlying layer of a semiconductor wafer. Furthermore, in certain embodiments, patterning process 102 may be used to reduce a lithographic pitch, potentially to a 1:1:1:1 line-space-line-space pitch ratio.

Throughout the description of patterning process 102, this disclosure describes an example in which patterning process 102 targets a line width of 45 nm, a recess (space) width of 45 nm, and a 1:1 feature pitch ratio (e.g., a 1:1:1:1 line-space-line-space pitch ratio). This disclosure, however, contemplates pursuing lines widths, recess widths, and pitch ratios of any suitable value, whether or not equal. For example, embodiments of this disclosure may provide an ability to form features that have a consistent pitch, but also may provide features that have a reduced pitch ratio even if not equal. As another example, the particular line width and spacer width that may be achieved may depend on the particular lithography technology used initially to form patterned structures in a photoresist layer.

Semiconductor workpiece 100 generically refers to any suitable semiconductor element being processed in accordance with embodiments of this disclosure. Semiconductor workpiece 100, or portions thereof, also may be referred to as a semiconductor wafer (or just wafer), such as a silicon wafer. Semiconductor workpiece 100 includes a substrate 104, an intermediate layer 106 positioned on substrate 104, and patterned features 108 positioned on intermediate layer 106.

Substrate 104 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 104 is not limited to any particular base structure, underlying layer or overlying layer, patterned or un-patterned, but rather, may include any such layer or base structure, and any combination of layers and/or base structures. Substrate 104 may be a bulk substrate such as a bulk silicon wafer, a silicon-on-insulator (SOI) wafer, or various other semiconductor substrates.

In certain embodiments, substrate 104 may include silicon germanium, silicon carbide, gallium arsenide, gallium nitride, or other compound semiconductors. In certain embodiments, substrate 104 includes heterogeneous layers such as silicon germanium on silicon, gallium nitride on silicon, silicon carbon on silicon, as well layers of silicon on a silicon or SOI substrate. In certain embodiments, substrate 104 is patterned or embedded in other components of a semiconductor device.

Intermediate layer 106 and patterned features 108 may be a photolithography stack. Intermediate layer 106 also may be referred to as an underlying layer, particularly in when described relative to patterned features 108 or the layer from which patterned features 108 are formed.

Intermediate layer 106 represents any suitable combination of one or more layers, one or more of which are to be patterned using patterned features 108. For example, intermediate layer 106 may include a hard mask layer, a planarization layer, an amorphous carbon layer, a silicon carbide layer, a bottom anti-reflective coating, and/or any other layer, one or more of which may be used for a patterning process. Additionally or alternatively, intermediate layer 106 may include a stack of films. For example, intermediate layer 106 may include films of dielectric and/or conductive materials, such as oxide, silicon oxide, silicon nitride, silicon oxynitride, silicon carbide, titanium nitride, tantalum nitride, their alloys, and combinations thereof. For example, intermediate layer 106 can be a dielectric layer or alternating dielectric layers.

Semiconductor workpiece 100 may be formed in any suitable manner, including using any suitable combination of wet and/or dry deposition and etch techniques. For example, semiconductor workpiece 100 may be deposited using any technique appropriate for the material to be deposited and the semiconductor feature being formed. Suitable deposition processes may include a spin-on coating process, a chemical vapor deposition (CVD) process, an atomic layer deposition (ALD) process, plasma deposition processes (e.g., a plasma-enhanced CVD (PECVD) process), and/or other layer deposition processes or combinations of processes.

Patterned features 108 may include photoresist structures 109 and recesses 110 defined by photoresist structures 109. Photoresist structures 109 may be formed of any suitable material and may be lines or other suitable types of semiconductor structures. In certain embodiments, photoresist structures 109 are formed of a photoresist material.

Photoresist structures 109 may be formed from a photoresist layer that is deposited over intermediate layer 106. The photoresist layer may include any suitable type of layer that may be used to form a masking layer for patterning intermediate layer 106, and may be made of a suitable material for acting as a photoresist. The photoresist layer is a layer to be patterned by an exposure step, such as by using an exposure module, which may be referred to as a scanner or stepper, and subsequent development step to form patterned features 108. For example, the photoresist layer may include a light-sensitive material made of a polymer, a solvent, and a sensitizer. The polymer is designed to change its structure when exposed to actinic radiation. The solvent allows the material of the photoresist layer to be spun to form a thin layer on an underlying layer (e.g., intermediate layer 106). The sensitizer (or inhibitor) controls the photoreaction in a polymer phase.

For example, the photoresist layer can be a chemically-amplified resist (CAR). As another example, the photoresist layer may be a metal-based resist material such as an organometallic material such as a metal oxide (MOx) photoresist. The photoresist material of the photoresist layer may be appropriate for the type of photolithography technology to be used to pattern the photoresist layer.

To form patterned features 108, a photoresist layer may be processed in two primary photolithography stages to create a pattern for further processing underlying layers (e.g., intermediate layer 106): an exposure stage and a development stage. During the exposure stage, the photoresist material reacts to ultraviolet (UV) or other light to form a pattern on the photoresist material. For example, the photoresist layer may be exposed to a pattern of actinic radiation (is irradiated) to form a pattern in the photoresist layer. Actinic radiation may be directed toward semiconductor workpiece 100, and particularly to a surface of the photoresist layer, possibly through a patterned mask, to cause a target pattern to form in the photoresist layer. The target pattern may include exposed regions and non-exposed regions.

Depending on the type of photoresist material used, portions of the photoresist layer that are exposed to UV light may become more or less soluble in a developer solution, such that those exposed regions may become more difficult or less difficult, respectively, to remove when processed using the developer solution. For example, due to exposure to the UV light, portions of the photoresist that are exposed to the UV light may have different material properties than non-exposed regions of the photoresist. The different material properties may include volatility, reactivity, and/or solubility, for example. During the development stage, the photoresist material is exposed to a developer solution to remove portions of the photoresist layer.

The photoresist material of the photoresist layer may be a positive photoresist or a negative photoresist. For a positive photoresist, areas of the photoresist layer that the semiconductor fabricator intends to remove (and that generally correspond to areas of an underlying layer that will be removed using the structures patterned from the photoresist layer as an etch mask) are exposed to the UV light. The UV light changes the chemical structure of the exposed areas of the photoresist such that the exposed areas become more soluble in a developer solvent that can be used to remove the exposed areas in a development processing stage while the areas of the photoresist that are not exposed remain. For a negative photoresist, portions of the photoresist layer that are exposed to UV polymerize, crosslink, network, or otherwise change chemical composition making the exposed regions less soluble to the developer solution while non-exposed regions can be removed using the developer solution.

In certain embodiments, the photoresist layer may include an agent-generating ingredient (e.g., a photoacid generator (PAG)) that releases a solubility-changing agent (acid, or photoacid) in response to UV light exposure. The generated photoacid may induce further chemical reactions in the photoresist layer, which may improve the tonality in the patterned version of the photoresist layer. For example, in response to exposure to actinic radiation, the agent-generating ingredient (e.g., the PAG) in exposed regions of the photoresist layer may generate a solubility-changing agent (e.g., acid) in exposed regions.

In certain embodiments, semiconductor workpiece 100 is transferred from a photolithography track system to an exposure module (which also may be referred to as a stepper module or scanner module) for exposing the photoresist layer to the pattern of actinic radiation. An example lithography system that includes a projection scanner is described in greater detail below with reference to FIG. 6.

The photoresist layer may be deposited in any suitable manner. For example, the photoresist layer may be deposited by spin-coating, spray-coating, dip-coating, or roll-coating. As a particular example, the photoresist layer may be deposited on semiconductor workpiece 100 using a spin-on deposition technique, which also may be referred to as spin-coating. An example spin-on deposition technique (spin-on deposition technique 114) is described in greater detail below with reference to FIG. 1B, and that description is incorporated by reference, with the material of the photoresist layer being substituted as the layer being deposited. It should be understood that this example spin-on deposition technique and associated values are provided as examples only.

In certain embodiments, the photoresist layer is deposited on intermediate layer 106 in a deposition module (e.g., a spin-coating module) of a larger track system for a lithography process. An example lithography system that includes a track system is described in greater detail below with reference to FIG. 6. It should be understood, however, that the photoresist layer may be deposited using any suitable dry or wet process.

This disclosure contemplates any suitable top coats (e.g., that operate as a diffusion barrier during an immersion lithography technique or server other suitable purposes) or other layers being deposited on the photoresist layer. As just one example, such a top coat may include a fluorinated polymer.

The photoresist layer may have any suitable thickness, which also may be referred to as height. In certain embodiments, the photoresist layer has a thickness of 5 nm to 5 µm, for example 20 nm to 1 µm. Appropriate thickness values may be driven, in part, by the photolithography technology being used to pattern the photoresist layer into patterned features 108. It should be understood that these thickness values are provided as examples only, and that the photoresist layer may have any suitable thickness. Photoresist structures 109 formed from the photoresist layer might or might not have the same initial height as the photoresist layer, though the height of photoresist structures 109 may change throughout patterning process 102.

In certain embodiments, a post-exposure bake (PEB) may be performed to modify portions of the photoresist layer to be soluble for development. For example, the PEB may modify portions of the photoresist layer to be soluble in one or more developers for removing the modified portions of the photoresist layer. The portions of the photoresist layer that the PEB solubilizes for development may include the exposed regions of the photoresist layer.

For example, with the previously-executed exposure process, a solubility-changing agent (e.g., acid) has been activated or otherwise generated in the exposed regions of the photoresist layer. The PEB may cause a solubility-changing agent to react with other substances (e.g., a polymer) of the exposed regions to cause the exposed regions to become soluble for development. For example, the PEB may cause a solubility-changing agent to convert one or more of the pendant groups of another substance (e.g., a polymer) of the exposed regions to cause the exposed regions to become soluble for development. This process also may be referred to as a deprotection reaction that causes the exposed regions to become deprotected (e.g., soluble) in a given developer.

In a developing lithography phase, the photoresist layer may be developed using a suitable development process to remove soluble portions of the photoresist layer. During the developing phase, using a positive photolithography process as an example, soluble portions of the photoresist layer may be removed using a suitable dry etch or wet etch process, and thereby forming the photoresist layer into patterned features 108 that can then be used to perform further fabrication process.

For example, development of the photoresist layer (e.g., to remove soluble portions of the photoresist layer 209) may be performed using an organic solvent. Potential example organic solvents may include propylene glycol methyl ether acetate (PGMEA), 2-Heptanone, isopropyl alcohol (IPA), 2-Pentanone, or another suitable organic solvent. In one example, the solvent dispense volume may be between 5 ml to 500 ml, for example 10 ml to 100 ml. The substrate (e.g., workpiece 100) may be secured to a rotating chuck that supports the substrate. The rotating speed during liquid dispense can be between 50 rpm to 3000 rpm, for example 1000 rpm to 2000 rpm. Although organic solvents are primarily described, this disclosure contemplates using any suitable solvent.

As another example, development of the photoresist layer (e.g., to remove soluble portions of the photoresist layer) may be performed in a gas phase with or without plasma. Example gases for such a gas phase may include hydrobromic acid (HBr), boron trichloride (BCL3), or another suitable gas/gas combination.

The soluble portions of the photoresist layer that are removed during the development phase may include the exposed regions of the photoresist layer. Following removal of the soluble portions of the photoresist layer, unexposed portions of the photoresist layer remain and form photoresist structures 109. Additionally, removal of soluble portions of the photoresist layer, and particularly the exposed regions, forms recesses 110 in the photoresist layer.

Figure 2:
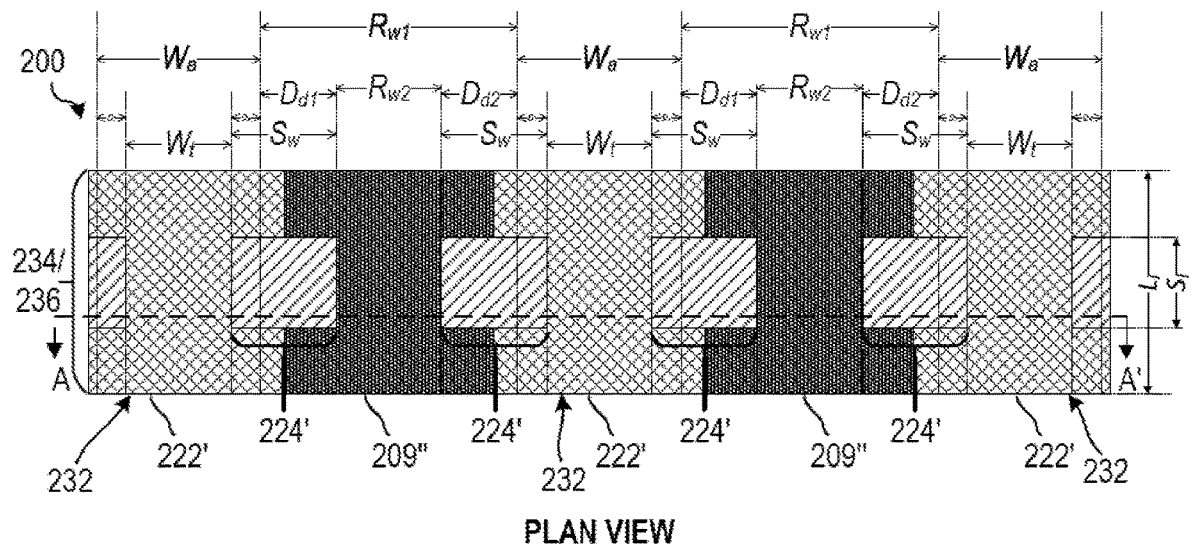
FIG. 2 illustrates a plan view of an example semiconductor workpiece during an example patterning process (e.g., at a state illustrated in FIG. 1J), according to certain embodiments.

Recesses 110 may be defined by photoresist structures 109. It should be understood that although two photoresist structures 109 are shown, additional photoresist structures 109 may be formed laterally from the illustrated photoresist structures 109, partial ones of which are shown at each end of the illustrated semiconductor workpiece 100. Recesses 110 may have any suitable lateral dimension. Although this disclosure primarily describes "recesses," other suitable features might be formed in or on a semiconductor substrate, including (whether or not considered "recesses") lines, holes, trenches, vias, and/or other suitable structures, using embodiments of this disclosure. As a particular example, recesses 110 may be shaped to form slot contacts. Recesses 110 also may be referred to as "spaces." In the illustrated example, as can be seen in plan view, recesses 110 extend an entire line length of photoresist structures 109. In other examples, as illustrated in FIG. 2 for example, recesses 110 may extend only a partial length of photoresist structures 109.

As described above, the lithography technology used to pattern the photoresist layer to form patterned features 108 may have an associated resolution consistent with the wavelength of radiation implemented using that lithography technology. Such photolithography technologies may include dry lithography (e.g., using 193 dry lithography), immersion lithography (e.g., using 193 nanometer immersion lithography), i-line lithography (e.g., using 365 nanometer wavelength UV radiation for exposure), H-line lithography (e.g., using 405 nanometer wavelength UV radiation for exposure), extreme ultraviolet (EUV) lithography, deep ultraviolet (DUV) lithography, or any suitable photolithography. Additionally, the lithography technology may be mask-based (e.g., projection lithography), maskless (e.g., electron beam (e-beam) lithography), or another suitable type of lithography.

As described above, a manufacturer may have a desired width of lines (e.g., photoresist structures 109) and recesses (e.g., recesses 110) that is smaller than a width that is directly achievable using a lithography technology that is available to the manufacturer. As a result, an actual width of recesses 110 ($W_a$) may be larger than a target width of recesses 110 ($W_t$) by an overage amount ($W_a$-$W_t$). Centering the target width ($W_t$) within a recess 110, the overage amount is represented as differences $D_1$ and $D_2$, with each of $D_1$ and $D_2$ representing half the overage amount. Photoresist structures 109 may have any suitable width ($R_{w1}$). The widths of lines (e.g., photoresist structures 109) and spaces (e.g., recesses 110) also may be referred to as the CD of those features.

To create features having smaller CD than those of photoresist structures 109, additional processing may be performed. In this particular example, an anti-spacer process may be performed on the semiconductor workpiece 100 of FIG. 1A, with yet further processing performed according to embodiments of this disclosure.

According to the particular example described in connection with FIGS. 1A-1K in which target widths for lines and spaces are 45 nm with a 1:1 line-space ratio, widths ($R_{w1}$) of photoresist structures may be 110 nm and actual widths ($W_a$) of recesses 110 may be 70 nm, for an initial lithography pitch of 180 nm (110 nm for line width plus 70 nm for recess width), with a target width ($W_t$) being 45 nm. Thus, in this example, recesses 110 have widths that are 25 nm larger than the target width, and this difference may be referred to as an overage amount ($D_1$+$D_2$,). The selection of widths ($R_{w1}$) of photoresist structures 109 to be 110 nm may facilitate forming additional 45 nm features (e.g., for recess 110) between the region marked for the target width ($W_t$) and a 45 nm center portion of photoresist structures 109. That is, a distance from an edge of a 45 nm center portion of photoresist structures 109 and a nearest edge of the region marked for the target width ($W_t$) is 45 nm, 32.5 nm of which is a (to be removed) portion of photoresist structure 109 and 12.5 nm of which is half of an overage amount (e.g., $D_1$ or $D_2$), and this 45 nm region in this example ultimately will become a recess 110 (e.g., see FIG. 1J).

Figure 1B:
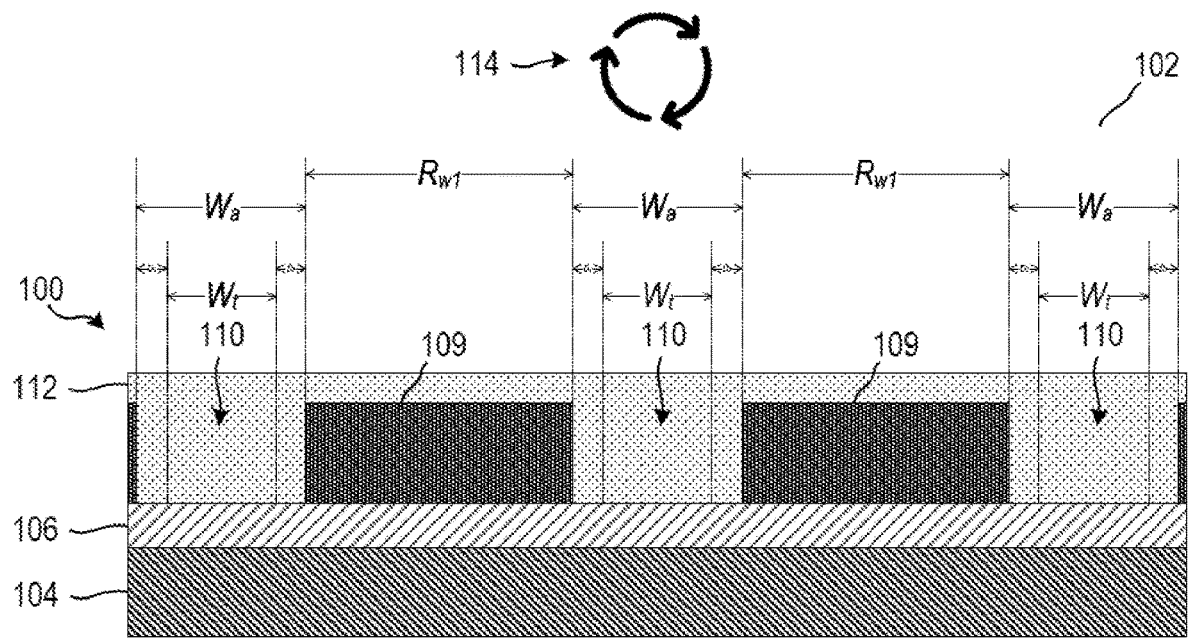
Figure 1B:
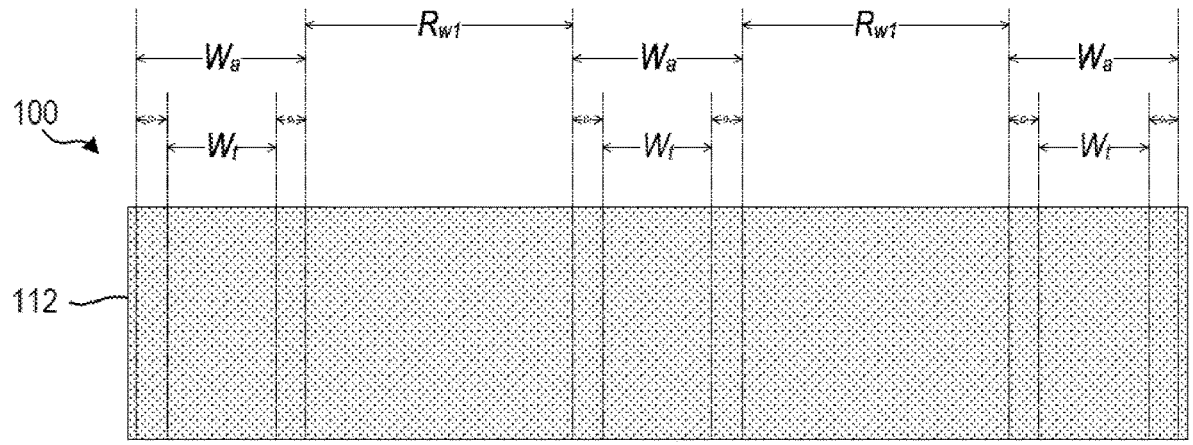

As shown in FIG. 1B, an overcoat film 112 may be deposited on semiconductor workpiece 100. Overcoat film 112 may fill recesses 110 and cover photoresist structures 109. Overcoat film 112 may be a multicomponent material that, as deposited, includes a first component and a second component. The first component could be, for example, a polymer. The second component could be, for example, a solubility-changing agent, such as an acid (e.g., a free acid). The second component could be, as another example, an agent-generating ingredient that, in response to a suitable agent-activation trigger (e.g., heat or radiation), generates a solubility changing agent (e.g., an acid). Example agent-generating ingredients may include a thermal-acid generator (TAG) that is configured to generate acid in response to heat or a PAG that is configured to generate acid in response to actinic radiation. The agent may be a substance that is configured to change the solubility of a material in which the agent is disposed in response to a suitable trigger (e.g., heat), and thus may be referred to as a solubility-changing agent.

Overcoat film 112 may be deposited on semiconductor workpiece 100 in any suitable manner. For example, overcoat film 112 may be deposited by spin-coating, spray-coating, dip-coating, or roll-coating. As a particular example, overcoat film 112 may be deposited on semiconductor workpiece 100 using a spin-on deposition technique 114, which also may be referred to as spin-coating. Additionally or alternatively, overcoat film 112 may be deposited using a CVD, PECVD, ALD, or other suitable process.

With spin-on deposition, a particular material (e.g., the material of overcoat film 112) is deposited on a substrate (e.g., semiconductor workpiece 100). The substrate is then rotated (if not already rotating, possibly at a relatively low velocity) at a relatively high velocity so that centrifugal force causes deposited material to move toward edges of the substrate, thereby coating the substrate. Excess material is typically spun off the substrate. In certain embodiments, spin-on deposition technique 114 includes dispensing liquid chemicals onto semiconductor workpiece 100 (e.g., on a top surface of intermediate layer 106 in recesses 110 and over exposed surfaces of photoresist structures 109) using a coating module with a liquid delivery system that may dispense one or more types of liquid chemicals. The dispense volume can be between 0.2 ml to 10 ml, for example 0.5 ml to 2 ml. The substrate (e.g., workpiece 100) may be secured to a rotating chuck that supports the substrate. The rotating speed during liquid dispense can be between 50 rpm to 3000 rpm, for example 1000 rpm to 2000 rpm. The system may also include an anneal module that may bake or apply light radiation to the substrate after the chemicals have been dispensed. It should be understood that this example spin-on deposition technique 114 and associated values are provided as examples only.

In certain embodiments, depending on the configuration and capabilities of the apparatuses involved, and to the extent semiconductor workpiece 100 has not already been transferred back to a track system, deposition of overcoat film 112 may be performed in the exposure system or by another deposition system separate from the exposure system and the track system, or may be performed after transferring semiconductor workpiece 100 from the exposure system back to the track system such that depositing overcoat film 112 (e.g., using spin-on deposition technique 114) is performed by a suitable deposition module of the track system. In certain embodiments, overcoat film 112 may be deposited in a deposition module (e.g., a spin-coating module) of a larger track system for a lithography process. An example lithography system that includes a track system is described in greater detail below with reference to FIG. 6.

Overcoat film 112 may have any suitable thickness. In certain embodiments, overcoat film 112 has a thickness of 0.5 nm to 50 nm, for example 5 nm to 100 nm. In certain embodiments, overcoat film 112 is tuned to fill recesses 110 between photoresist structures 109 so that an approximately equal volume of a solubility-changing agent (e.g., solubility-changing agent 117, described below with reference to FIG. 1C) exists along the sidewalls of photoresist structures 109.

In certain embodiments, a thickness of overcoat film 112 depends at least in part on a thickness of photoresist structures 109, as overcoat film 112 may be sufficiently thick to fill recesses 110 and cover photoresist structures 109. It should be understood that these thickness values are provided as examples only, and that overcoat film 112 may have any suitable thickness.

Figure 1C:
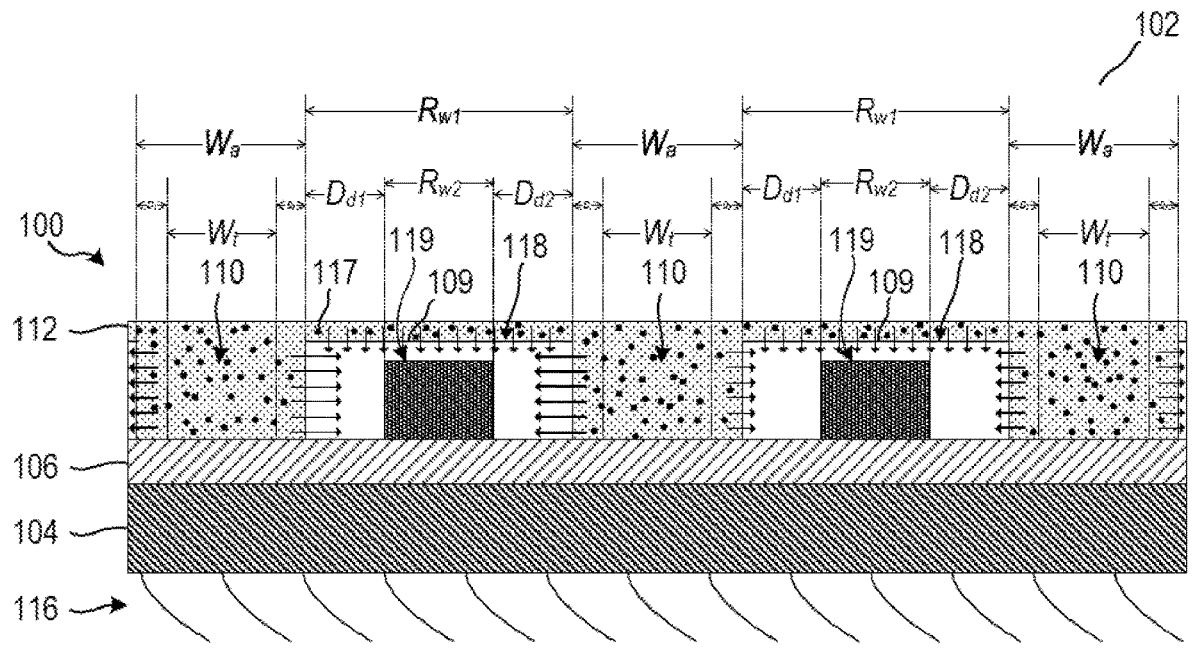
Figure 1C:
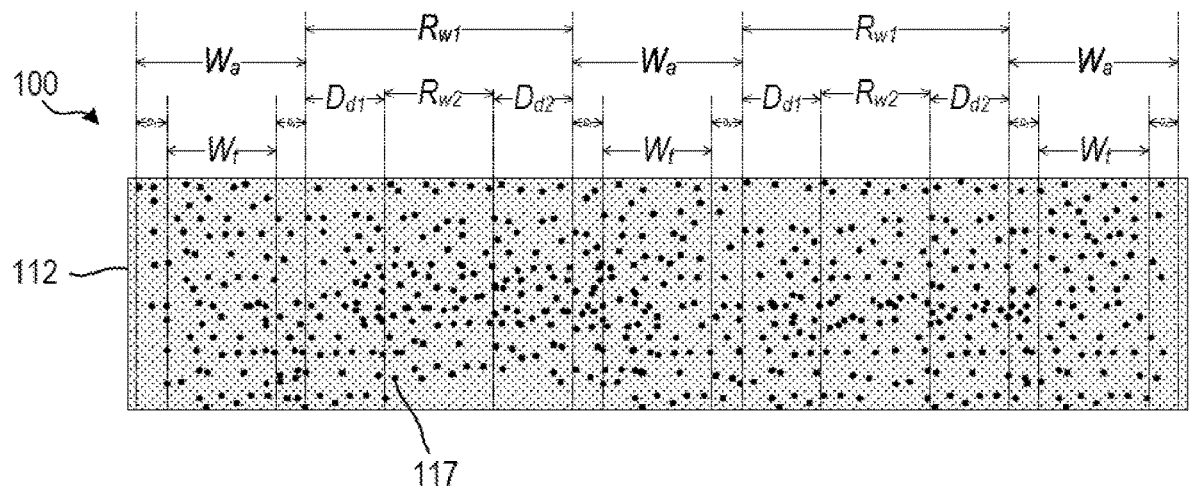

As shown in FIG. 1C, a bake 116 of semiconductor workpiece 100 may be performed. Baking semiconductor workpiece 100 may cause a solubility-changing agent 117 (e.g., acid) of overcoat film 112 to diffuse into a portion of photoresist structures 109 and to cause those portions of photoresist structures 109 to become soluble in a developer, thereby forming soluble portions 118 of photoresist structures 109. Portions of photoresist structures 109 that remain insoluble in the developer (e.g., portions into which solubility-changing agent 117 did not diffuse) may be referred to as insoluble portions 119.

For example, in the case of overcoat film 112 including a free acid, solubility-changing agent 117 may be the free acid and baking semiconductor workpiece 100 may cause solubility-changing agent 117 to diffuse into a portion of photoresist structures 109 and to cause those portions of photoresist structures 109 to become soluble in a developer.

As another example, in the case of overcoat film 112 including a TAG as an agent-generating ingredient, baking semiconductor workpiece 100 may cause the TAG to generate solubility-changing agent 117 (which may be referred to as activating the acid), cause the generated solubility-changing agent 117 to diffuse into a portion of photoresist structures 109, and cause those portions of photoresist structures 109 to become soluble in a developer. For example, the TAG may generate solubility-changing agent 117 within overcoat film 112 in response to heat. Thus, in certain embodiments, the heat associated with bake 116 both causes the agent-generating ingredient (e.g., a TAG) in overcoat film 112 to generating solubility-changing agent 117 within overcoat film 112 and causes the generated solubility-changing agent 117 to diffuse into and change the solubility of suitable portions of photoresist structures 109.

As another example, in the case of overcoat film 112 including a PAG as an agent-generating ingredient, an exposure step that includes exposing overcoat film 112 to radiation may be performed prior to baking semiconductor workpiece 100 (e.g., prior to executing bake 116). The PAG may generate solubility-changing agent 117 in response to the exposure to radiation (which may be referred to as activating the acid). Bake 116 may cause the generated solubility-changing agent 117 to diffuse into a portion of photoresist structures 109, and cause those portions of photoresist structures 109 to become soluble in a developer.

The exposure suitable for causing the PAG to generate solubility-changing agent may be a flood exposure or may be more similar to the exposure used to form photoresist structures 109 in FIG. 1A. In the case of a flood exposure, it may be possible to perform the exposure in an on-track module of a track-based lithography system without moving semiconductor workpiece 100 to a stepper for more complex exposure. In the case of a more complex exposure, semiconductor workpiece 100 may be moved to a stepper for exposure and then returned to the track. This disclosure contemplates performing the exposure step in any suitable manner.

Of course, this disclosure contemplates including other suitable types of agent-generating ingredients that generate solubility-changing agent 117 in response to a suitable activation trigger (e.g., heat, radiation, or another suitable trigger), if appropriate.

Baking semiconductor structures 100 generally causes solubility-changing agent 117 to diffuse into perimeter portions of photoresist structures 109 to a target depth, and to modify those perimeter portions to be soluble in a developer, forming soluble portions 118. Bake 116 may be executed to achieve the target depth of diffusion of solubility-changing agent 117 (e.g., acid) into perimeter portions of photoresist structures 109 to cause those portions of photoresist structures 109 to become soluble for subsequent development, as described in greater detail with reference to FIG. 1F. The target depth of diffusion could be, for example, a target depth of diffusion into perimeter portions of photoresist structures 109 (forming soluble portions 118) to ultimately cause a thinning, or reduction in width (and possibly height), of photoresist structures 109 by the amount of the target depth.

For example, the modified perimeter portions (soluble portions 118) may form a deprotected/soluble shell-like structure around insoluble portions 119 of photoresist structures 109, consuming a portion of an outer perimeter of photoresist structures 109 and thereby, when removed via a development process, reducing both a vertical and lateral dimension of photoresist structures 109. Among other factors, baking time and/or temperature may be optimized to control a depth of diffusion of solubility-changing agent 117 to achieve the target depth. The depth of diffusion of solubility-changing agent 117 into photoresist structures 109 may be the same or different in the vertical and lateral dimensions.

Insoluble portions 119 of photoresist structures 109 remain insoluble in the developer. Insoluble portions 119 of photoresist structures 109 also may be referred to as remaining portions of photoresist structures 109 (e.g., remaining, following development at a subsequent stage). Insoluble portions 119 may have a reduced width (and possibly height/thickness) relative to a width of photoresist structures 109.

The depth of diffusion of solubility-changing agent 117 into photoresist structures 109 may be deliberately designed and controlled to achieve a desired width reduction of photoresist structures 109 when developed. In the illustrated example, a lateral depth of diffusion (e.g., on sidewall surfaces of photoresist structures 109) of solubility-changing agent 117 into photoresist structures 109 is shown as $D_{d1}$ and $D_{d2}$ such that, after development in a subsequent step, widths ($R_{w1}$) of photoresist structures 109 are reduced by $D_{d1}+D_{d2}$ and insoluble portions 119 of photoresist structures 109 have a widths $R_{w2}$. For example, insoluble portions 119 of photoresist structures 109 have a reduced width, shown as $R_{w2}$, relative to the width $R_{w1}$ of photoresist structures 109 in FIG. 1A, and a difference between $R_{w1}$ and $R_{w2}$ represents a depth of diffusion ($D_{d1}+D_{d2}$) of solubility-changing agent 117, at least in a lateral dimension. In certain embodiments, the depth of diffusion, and resulting change in solubility of portions of photoresist structures 109, is approximately equal on all sides of photoresist structures 109. The lateral depth of diffusion of solubility-changing agent 117 into portions of photoresist structures 109 ($D_{d1}$ and $D_{d2}$) could also be referred to as a lateral thickness of soluble portions 118.

Soluble portions 118 also include a vertical component, which may be any suitable amount according to particular implementations. In other words, solubility-changing agent 117 may diffuse by a vertical depth of diffusion into photoresist structures 109 (e.g., on top surfaces of photoresist structures 109) such that following development heights of patterned features 108 are reduced to heights of insoluble portions 119.

A target lateral depth of diffusion of solubility-changing agent 117 into photoresist structures 109 (e.g., target values for $D_{d1}$ and $D_{d2}$) may depend on a variety of factors. Due to the potential dependence on other steps of patterning process 102, a depth of diffusion of solubility-changing agent 117 into photoresist structures 109 is described in greater detail following the description of FIG. 1J. In short, however, a lateral depth of diffusion of solubility-changing agent 117 into photoresist structures 109 may depend on whether subsequent steps of patterning process 102 are expected to further reduce a lateral dimension (width) of photoresist structures 109.

To the extent subsequent steps of patterning process 102 are not expected to further reduce a lateral dimension (width) of photoresist structures 109, then a lateral depth of diffusion of solubility-changing agent 117 into photoresist structures 109 ($D_{d1}+D_{d2}$) may be sufficient such that widths of insoluble portions 119 ($R_{w2}$) are a target width for a CD of photoresist structures 109. For the particular example described in connection with FIGS. 1A-1J, in a scenario in which subsequent steps of patterning process 102 are not expected to further reduce a lateral dimension (width) of photoresist structures 109, depths of diffusion of solubility-changing agent 117 into photoresist structures 109 may be 32.5 nm (45 nm minus ½ the overage amount (one-half being $D_{d1}$ or $D_{d2}$), or 12.5 in this example) laterally on each side of photoresist structures 109, which, following subsequent development, will bring the width $R_{w2}$ of the photoresist structures 109 to the target width of 45 nm (110 nm minus 32.5 nm (on a first side of photoresist structure 109) minus 32.5 nm (on a second side of photoresist structure 109).

To the extent subsequent steps of patterning process 102 are expected to further reduce a lateral dimension (width) of photoresist structures 109, then a lateral depth of diffusion of solubility-changing agent 117 into photoresist structures 109 ($D_{d1}+D_{d2}$) may be biased to account of this expected future reduction such that the lateral depth of diffusion at FIG. 1C is less than a full amount of diffusion that would result in widths of insoluble portions 119 ($R_{w2}$) being a target width for CDs of photoresist structures 109. For the particular example described in connection with FIGS. 1A-1J, in a scenario in which subsequent steps of patterning process 102 are expected to further reduce a lateral dimension (width) of photoresist structures 109 (e.g., in FIGS. 1I-1J), depths of diffusion of solubility-changing agent 117 into photoresist structures 109 may be less than 32.5 nm (45 nm minus ½ the overage amount (one-half being $D_{d1}$ or $D_{d2}$), or 12.5 in this example) laterally on each side of photoresist structures 109 by an amount equal to one-half the expected amount of future reduction in width of photoresist structures 109 (specifically, future reduction in width of photoresist structures 109' in FIGS. 1I-1J).

In other words, as a result of forming soluble portions 118 and insoluble portions 119 at the stage illustrated in FIG. 1C, widths of insoluble portions 119 ($R_{w2}$) might by a final target width (CD) (45 nm in one example) for photoresist structures 109 or might be greater than target widths (CD) for photoresist structures 109.

Concentration of solubility-changing agent 117 (e.g., acid), diffusivity of solubility-changing agent 117, and process parameters of bake 116 may influence one another and be tuned for a particular process. A general concentration range for the solubility changing agent may be 2-10% of the total film solids. Molecular weight and sterics based on the structure of solubility-changing agent 117 (e.g., compact organic groups vs. nodular such as spokes on a wheel) may be primary influencers of diffusivity of solubility-changing agent 117. An example diffuse super acid used in photoresist technology may include trifluoromethane sulfonic acid. An example mid-range diffusive acid may be perfluorobutane sulfonic acid. Examples of a low diffusivity acid may include perfluorooctane sulfonic acid and p-trifluoromethane benzene sulfonic acid.

In certain embodiments, bake 116 may be performed by heating semiconductor workpiece 100 in a process chamber at a temperature between 50° C. to 250° C., for example between 60° C. to 120° C. in certain embodiments, in vacuum or under a gas flow. In a particular example, semiconductor workpiece 100 is baked for 1 to 3 minutes. The bake conditions of bake 116 may be selected to promote the diffusion of solubility-changing agent 117 (and possibly generation of the solubility-changing agent 117 from an agent-generating ingredient of overcoat film 112, if applicable) and associated change in solubility of a perimeter of photoresist structures 109 to the target depth. This disclosure contemplates executing bake 116 in any suitable manner.

Figure 1D:
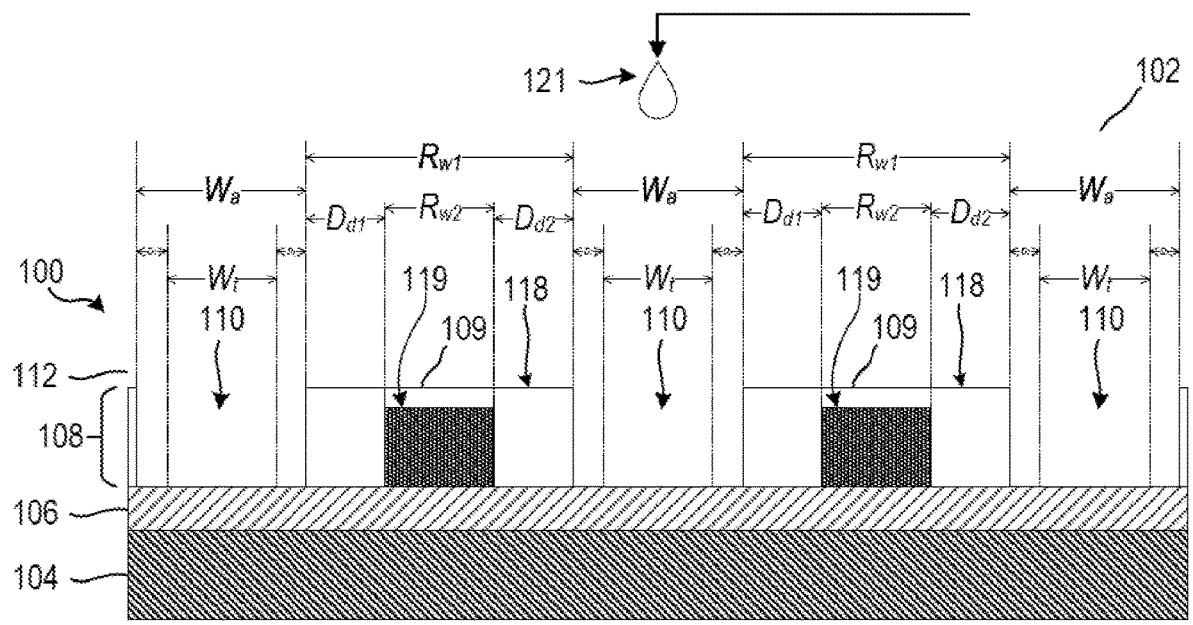
Figure 1D:
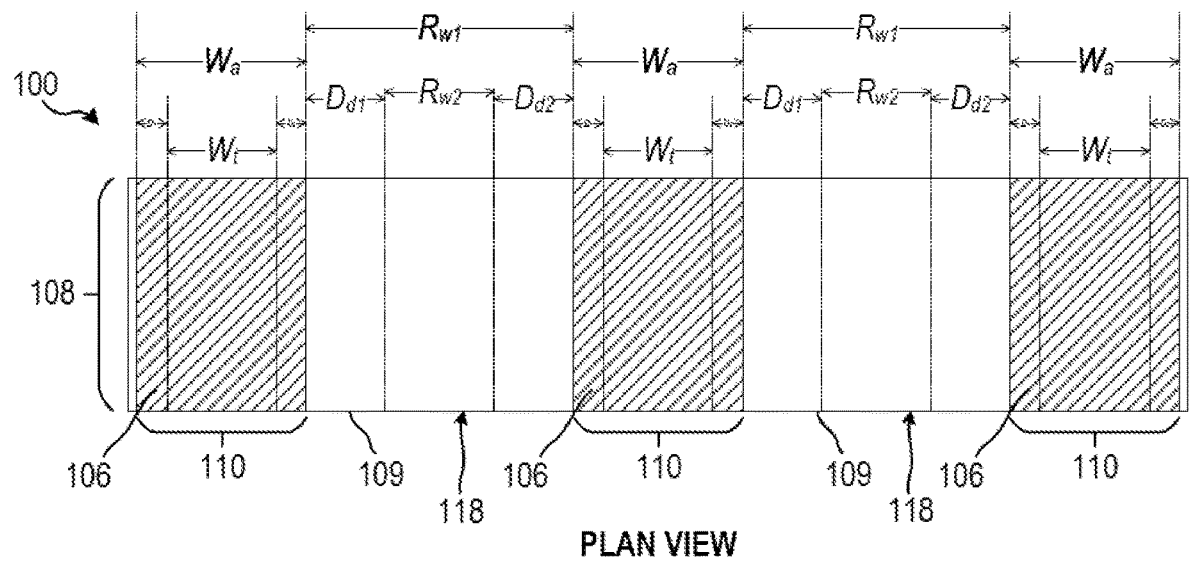

As illustrated in FIG. 1D, overcoat film 112 may be removed selectively from semiconductor workpiece 100, with minimal to no removal of photoresist structures 109, including little to no removal of soluble portions 118 and insoluble portions 119 of photoresist structures 109. This disclosure contemplates selectively removing overcoat film 112 in any suitable manner. In certain embodiments, overcoat film 112 may be removed selectively from semiconductor workpiece 100 using a suitable solvent wash 121 or other developer, with the solvent being selective to removing overcoat film 112.

In certain embodiments, solvent wash 121 may be performed using a solvent of 4-methyl-2-pentanol or diisoamyl ether to selectively remove overcoat film 112. Although this disclosure describes particular solvents for solvent wash 121, this disclosure contemplates using any suitable solvent for solvent wash 121.

In certain embodiments, with the selective removal of overcoat film 112, at this state of patterning process 102, recesses 110 have been re-revealed and continue to have an actual width ($W_a$) that exceeds a target width ($W_t$). For the particular example described in connection with FIGS. 1A-1J, at the state illustrated in FIG. 1D, recesses 110 have an actual width ($W_a$) of 70 nm that exceeds target width ($W_t$) of 45 nm.

Figure 1E:
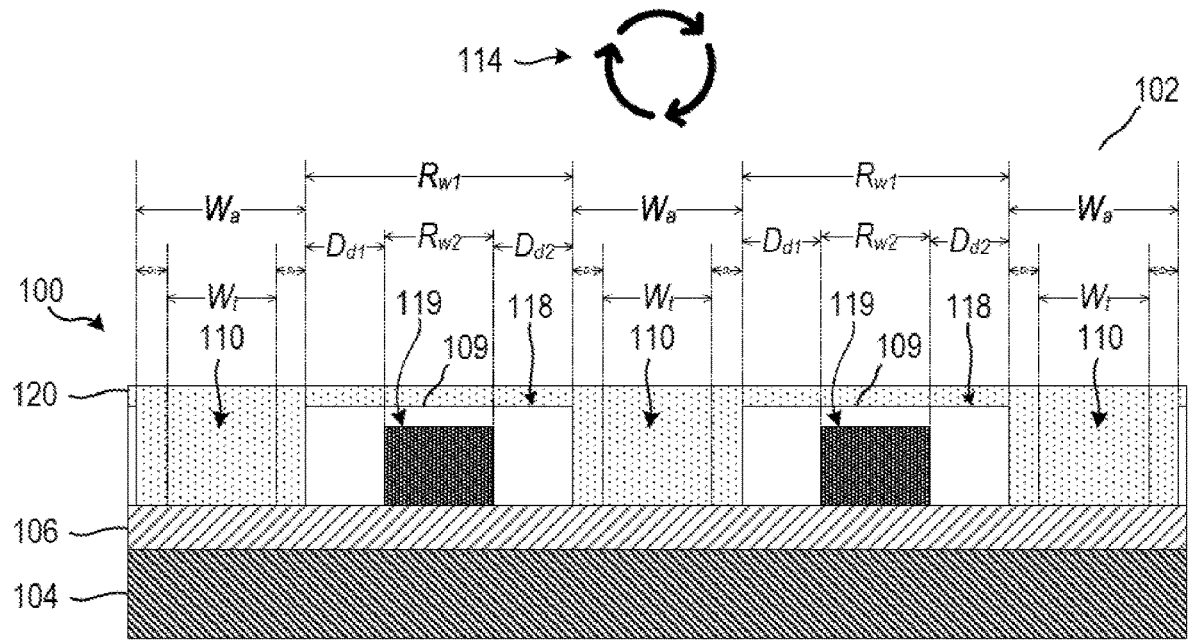
Figure 1E:
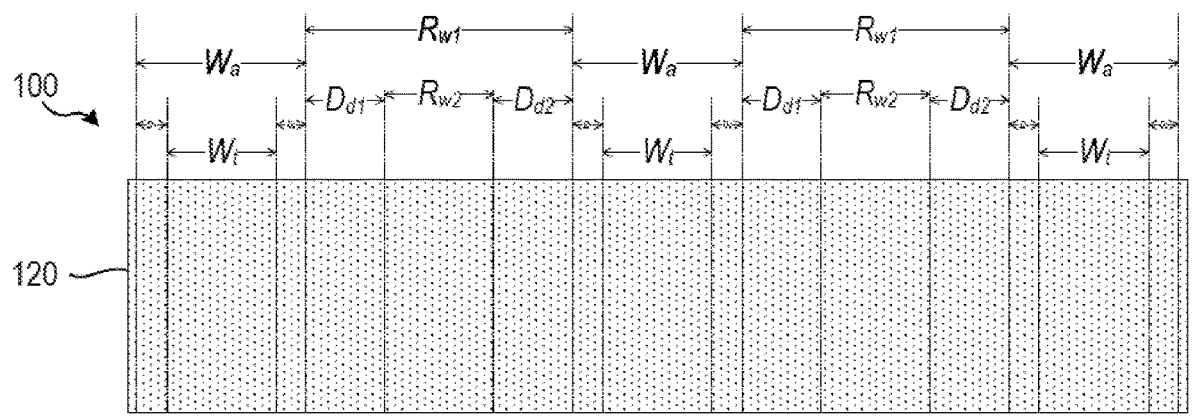

As illustrated in FIG. 1E, an overcoat film 120 may be deposited on semiconductor workpiece 100. Overcoat film 120 may fill recesses 110 and cover photoresist structures 109, including over soluble portions 118 of photoresist structures 109.

Overcoat film 120 may be deposited on semiconductor workpiece 100 in any suitable manner. For example, overcoat film 120 may be deposited by spin-coating, spray-coating, dip-coating, or roll-coating. As a particular example, overcoat film 120 may be deposited on semiconductor workpiece 100 using a spin-on deposition technique 114, in a similar manner to that described above with reference to overcoat film 112 in FIG. 1B. The description of spin-on deposition technique 114 from FIG. 1B is incorporated by reference, with the material of overcoat film 120 replacing the material of overcoat film 112. Additionally or alternatively, overcoat film 120 may be deposited using a CVD, PECVD, ALD, or other suitable process.

In certain embodiments, overcoat film 120 may be deposited in a deposition module (e.g., a spin-coating module) of a larger track system for a lithography process. An example lithography system that includes a track system is described in greater detail below with reference to FIG. 6.

In certain embodiments, overcoat film 120 may include a polymer material and a crosslinking agent. As particular examples, overcoat film 120 may include mixtures distributed under the classification of developable bottom anti-reflective coating (DBARC) materials. In response to a suitable trigger (e.g., a suitable amount of heat), the crosslinking agent may react with the polymer material to cause the material of overcoat film 120 to harden. As an example, the crosslinking agent may include a vinyloxy group and/or an N-methoxymethylamide group as a reactive group. For example, the vinyloxy group may promote crosslinking (e.g., at least in part via formation of an acetal bond) with carboxyl groups and/or phenolic hydroxyl groups in the polymer material of overcoat film 120. Example crosslinking is described below with reference to FIG. 1G.

Overcoat film 120 may have any suitable thickness. In certain embodiments, overcoat film 120 has a thickness of 0.5 nm to 5 μm, for example 20 nm to 1 μm. In certain embodiments, overcoat film 120 is tuned to fill recesses 110 between photoresist structures 109. In certain embodiments, a thickness of overcoat film 120 depends at least in part on a thickness of photoresist structures 109, as overcoat film 120 may be sufficiently thick to fill recesses 110 and cover photoresist structures 109. It should be understood that these thickness values are provided as examples only, and that overcoat film 120 may have any suitable thickness.

Figure 1F:
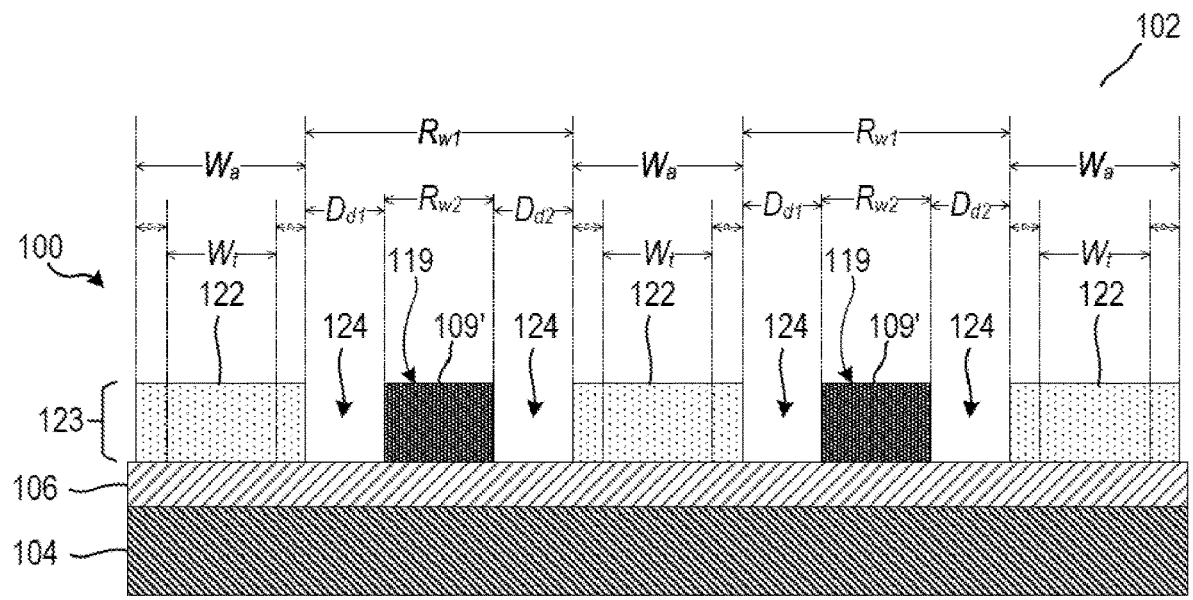
Figure 1F:
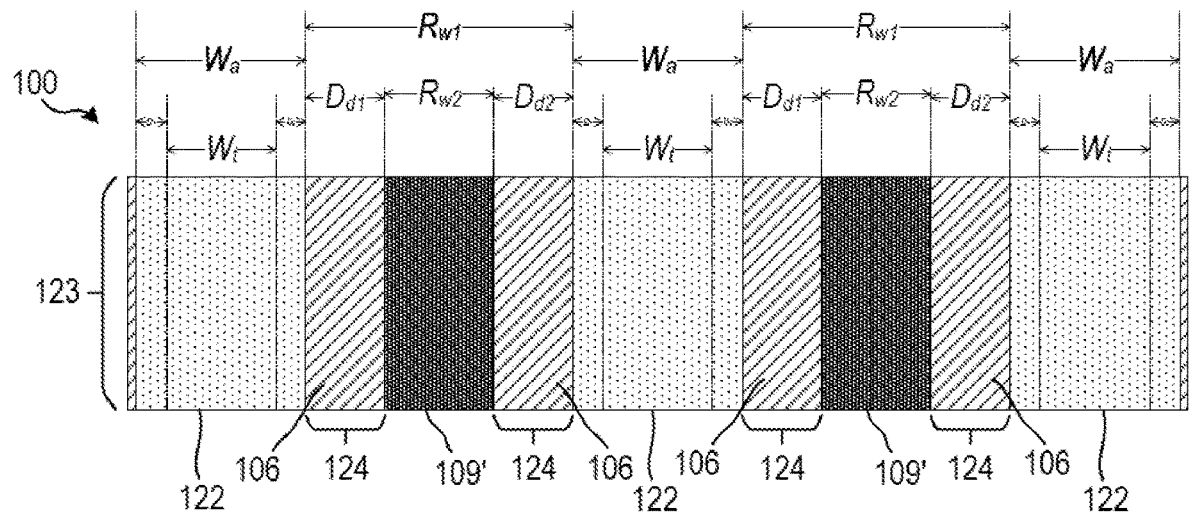

As illustrated in FIG. 1F, soluble portions 118 of photoresist structures 109 and portions of overcoat film 120 may be removed selectively to reveal patterned features 123. Patterned features 123 may include insoluble portions 119 of photoresist structures 109, overcoat structures 122 remaining from overcoat film 120, and recesses 124. This disclosure contemplates removing soluble portions 118 of photoresist structures 109 and the portions of overcoat film 120 in any suitable manner.

In certain embodiments, the portions of overcoat film 120 and soluble portions 118 of photoresist structures 109 are removed selectively using a developer. For example, the developer may remove sufficient portions of overcoat film 120 to reveal soluble portions 118 of photoresist structures 109, and then remove those soluble portions 118 of photoresist structures 109 at a more rapid removal rate (e.g., dissolution rate). As a particular example, the developer may remove at a first removal rate sufficient portions of overcoat film 120 to reveal soluble portions 118 of photoresist structures 109, and then remove those soluble portions 118 of photoresist structures 109 at a greater second removal rate. In certain embodiments, the second removal rate is significantly larger than the first removal rate (1000:1, as a non-limiting example) such that once soluble portions 118 of photoresist structures 109 are revealed, those soluble portions 118 of photoresist structures 109 are removed much more rapidly than additional removal of portions of overcoat film 120.

In certain embodiments, the portions of overcoat film 120 and soluble portions 118 of photoresist structures 109 are removed selectively in a wet process by treating semiconductor workpiece 100 with a developer solution to dissolve the portions of overcoat film 120 and soluble portions 118 of photoresist structures 109. The appropriate developer solution may depend in part on the material of overcoat film 120 and soluble portions 118 of photoresist structures 109. In certain embodiments, the developer solution may include an aqueous alkaline solution that includes a water-soluble organic base. As particular examples, the developer solution may include tetramethylammonium hydroxide (TMAH).

Alternatively, a dry process may be used in other embodiments. The dry process may include, for example, a selective plasma etch process or a thermal process, which may eliminate the use of a developing solution. In certain embodiments, the dry process may be performed using reactive ion etching (RIE) process or atomic layer etching (ALE).

Removal of soluble portions 118 of photoresist structures 109 forms photoresist structures 109' formed from insoluble portions 119 of photoresist structures 109. Additionally, removal of the portions of overcoat film 120 and soluble portions 118 of photoresist structures 109 forms overcoat structures 122 from overcoat film 120 (e.g., remaining portions of overcoat film 120). Removing soluble portions 118 of photoresist structures 109 reveals recesses 124 defined by overcoat structures 122 and photoresist structures 109'. In this example, at the state illustrated in FIG. 1F, overcoat structures 122 occupy the space of previous recesses 110, and recesses 124 occupy the space of soluble portions 118 of photoresist structures 109. At the state illustrated in FIG. 1F, photoresist structures 109' have a width $R_{w2}$, overcoat structures 122 have a width $W_a$, and recesses 124 have a width $D_{d1}$ or $D_{d2}$ (e.g., $D_{d1}$ and $D_{d2}$ may be equal). Furthermore, at the state illustrated in FIG. 1F, while photoresist structures 109' potentially have a target width (e.g., a target CD of patterning process 102), depending on a depth of diffusion of solubility-changing agent 117 at the state illustrated in FIG. 1C and subsequent removal of soluble portions 118 at the state illustrated in FIG. F, recesses 124 are narrower than a target width and overcoat structures 122 are wider than a target width (e.g., $W_t$).

For the particular example described in connection with FIGS. 1A-1J, at the state illustrated in FIG. 1F, a width of photoresist structures 109' may be 45 nm (the target CD in this example), a width of overcoat structures 122 may be 70 nanometers (the actual width $W_a$ of recesses 110 that where overcoat structures 122 now are formed), and a width of recesses 124 may be 32.5 nm. Thus, in this example, photoresist structures 109' have the target width, overcoat structures 122 are wider than the target width, and recesses 124 are narrower than the target width.

Figure 1G:
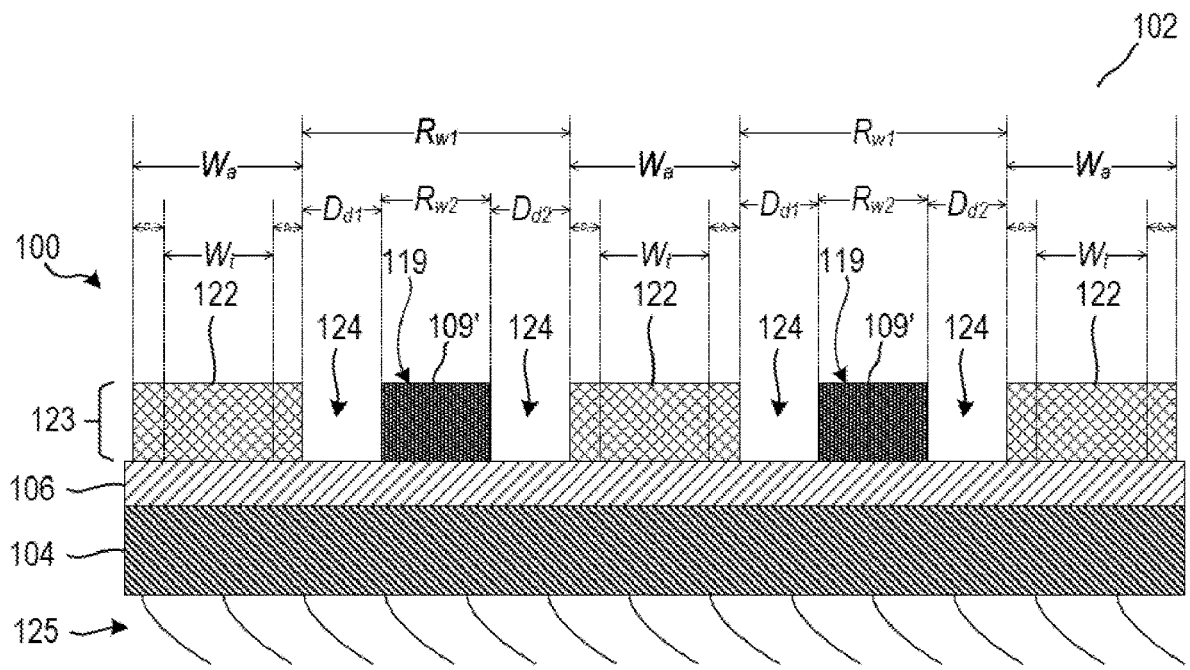
Figure 1G:
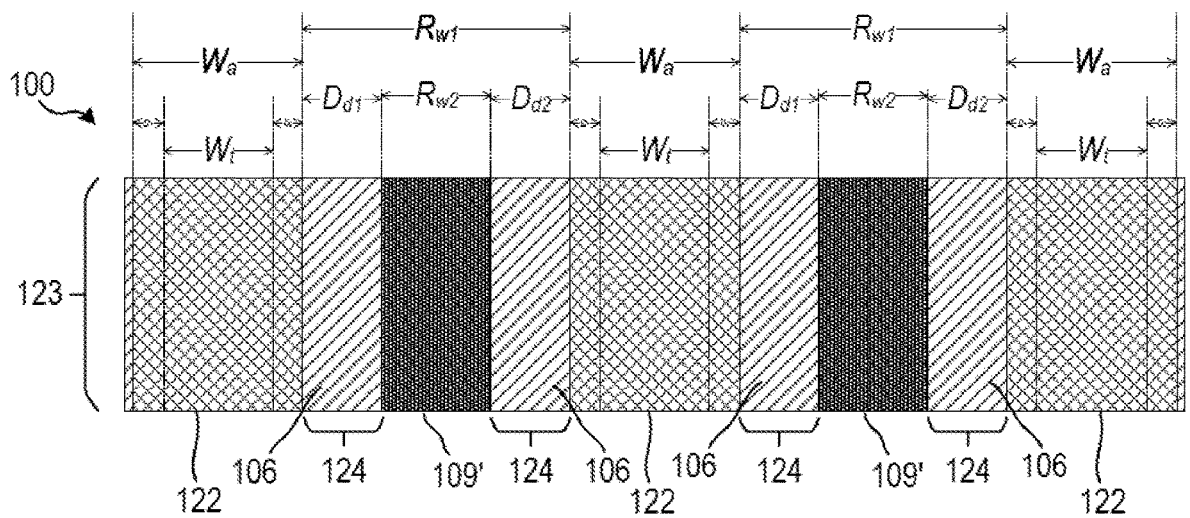

As illustrated in FIG. 1G, a bake 125 of semiconductor workpiece 100 may be performed. Baking semiconductor workpiece 100 may cause a solubility-changing reaction to occur in overcoat structures 122 (formed from overcoat film 120). Thus, in certain embodiments, the solubility-changing reaction is a thermally-induced solubility-changing reaction.

This solubility-changing reaction may have one or more effects. For example, the solubility-changing reaction may cause overcoat structures 122 to become insoluble in a casting solvent that is used in a subsequent step of patterning process 102 in which an additional overcoat film is deposited (e.g., as illustrated in and described below with reference to FIG. 1H). As another example, the solubility-changing reaction may cause overcoat structures 122 to become insoluble in a developer used in a subsequent step to remove that additional overcoat film and to-be-modified portions of overcoat structures 122 (e.g., as illustrated in and described below with reference to FIG. 1J).

In an example in which overcoat film 120, and particularly overcoat structures 122 that remain from overcoat film 120, includes a polymer, the solubility-changing reaction caused by bake 125 may include polymer crosslinking in overcoat structures 122, the polymer crosslinking rendering overcoat structures 122 insoluble in a casting solvent used in a subsequent step of patterning process 102 and/or in a developer used in a subsequent step, as described above. For example, polymer chains of overcoat structures 122 may be crosslinked via bond formation induced by heat. In certain embodiments, the crosslinking may include C—C bond formation or S—S bond formation among others. As just one particular example, overcoat film 120 may include hydroxystyrene that may undergo crosslinking in response to adequate heat.

In addition to or in place of bake 125, in certain embodiments, the solubility-changing reaction of FIG. 1G may be a photoinduced solubility-changing reaction. For example, irradiating semiconductor workpiece 100 (e.g., exposing overcoat film 120, and particularly overcoat structures 122, to actinic radiation) may cause a solubility-changing reaction to occur in overcoat structures 122. If appropriate, the irradiation may be accompanied by executing bake 125. In an example in which overcoat film 120, and particularly overcoat structures 122 that remain from overcoat film 120, includes a polymer, the solubility-changing reaction caused by exposure (possibly with an accompanying bake 125) may include polymer crosslinking in overcoat structures 122, the polymer crosslinking rendering overcoat structures 122 insoluble in a casting solvent used in a subsequent step of patterning process 102 and/or in a developer used in a subsequent step, as described above. For example, polymer chains of overcoat structures 122 may be crosslinked via bond formation induced by actinic radiation exposure. In certain embodiments, the crosslinking may include C—C bond formation or S—S bond formation among others. Such bond formations may be catalyzed by a photoacid generated by the actinic radiation exposure. As just one particular example, overcoat film 120 may include hydroxystyrene that may undergo crosslinking in response to actinic radiation exposure.

The exposure suitable for causing the solubility-changing reaction to occur in overcoat structures 122 may be a flood exposure or may be more similar to the exposure used to form photoresist structures 109 in FIG. 1A. In the case of a flood exposure, it may be possible to perform the exposure in an on-track module of a track-based lithography system without moving semiconductor workpiece 100 to a stepper for more complex exposure. In the case of a more complex exposure, semiconductor workpiece 100 may be moved to a stepper for exposure and then returned to the track. Of course, this disclosure contemplates performing the exposure step in any suitable manner.

To the extent bake 125 is performed, in certain embodiments, bake 125 may be performed by heating semiconductor workpiece 100 in a process chamber at a temperature between 50° C. to 250° C., for example between 80° C. to 140° C. in certain embodiments, in vacuum or under a gas flow. In certain embodiments, bake 125 is performed at a higher temperature than bake 116, such as at an approximately 20° C. higher temperature. In a particular example, semiconductor workpiece 100 is baked for 1 to 3 minutes. The bake conditions of bake 125 may be selected to promote the solubility-changing reaction (e.g., crosslinking of the polymer of overcoat structures 122). This disclosure contemplates executing bake 125 in any suitable manner.

Figure 1H:
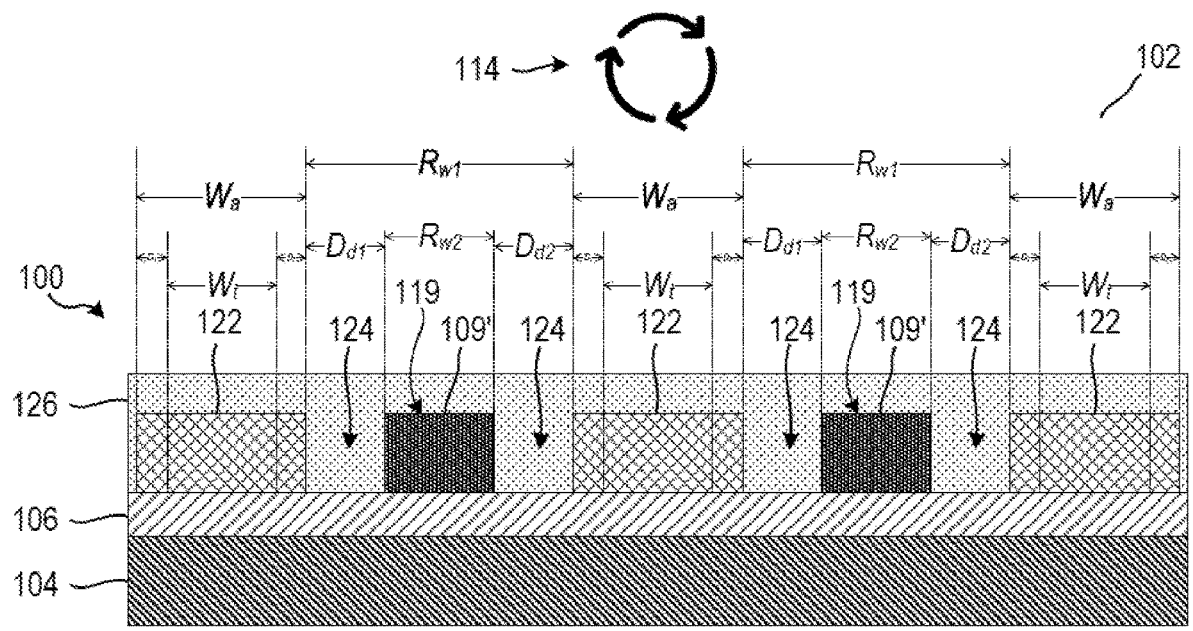
Figure 1H:
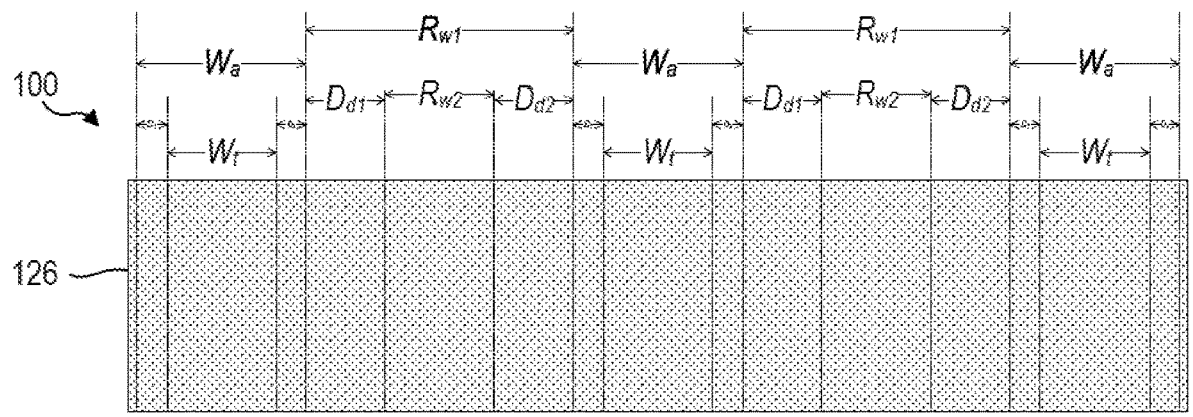

As illustrated in FIG. 1H, an overcoat film 126 may be deposited on semiconductor workpiece 100. Overcoat film 126 may fill recesses 124 and cover photoresist structures 109' and overcoat structures 122. In certain embodiments, overcoat film 126 is a similar material to overcoat film 112.

Overcoat film 126 may be a multicomponent material that, as deposited, includes a first component and a second component. The first component could be, for example, a polymer. The second component could be, for example, a solubility-changing agent, such as an acid (e.g., a free acid). The second component could be, as another example, an agent-generating ingredient that, in response to a suitable agent-activation trigger (e.g., heat or radiation), generates a solubility changing agent (e.g., an acid). Example agent-generating ingredients may include a TAG that is configured to generate acid in response to heat or a PAG that is configured to generate acid in response to actinic radiation. The agent may be a substance that is configured to change the solubility of a material in which the agent is disposed in response to a suitable trigger (e.g., heat), and thus may be referred to as a solubility-changing agent.

Overcoat film 126 may be deposited on semiconductor workpiece 100 in any suitable manner. For example, overcoat film 126 may be deposited by spin-coating, spray-coating, dip-coating, or roll-coating. As a particular example, overcoat film 126 may be deposited on semiconductor workpiece 100 using a spin-on deposition technique 114, in a similar manner to that described above with reference to overcoat film 112 in FIG. 1B. The description of spin-on deposition technique 114 from FIG. 1B is incorporated by reference, with the material of overcoat film 126 replacing the material of overcoat film 112. Additionally or alternatively, overcoat film 126 may be deposited using a CVD, PECVD, ALD, or other suitable process.

In certain embodiments, overcoat film 126 may be deposited in a deposition module (e.g., a spin-coating module) of a larger track system for a lithography process. An example lithography system that includes a track system is described in greater detail below with reference to FIG. 6.

Overcoat film 126 may have any suitable thickness. In certain embodiments, overcoat film 126 has a thickness of 0.5 nm to 5 μm, for example 20 nm to 1 μm. In certain embodiments, overcoat film 126 is tuned to fill recesses 124 between photoresist structures 109' and overcoat structures 122 so that an approximately equal volume of a solubility-changing agent (e.g., solubility-changing agent 128, described below with reference to FIG. 1I) exists along the sidewalls of photoresist structures 109' and overcoat structures 122. In certain embodiments, a thickness of overcoat film 126 depends at least in part on a thickness of photoresist structures 109' and overcoat structures 122, as overcoat film 126 may be sufficiently thick to fill recesses 124 and cover photoresist structures 109' and overcoat structures 122. It should be understood that these thickness values are provided as examples only, and that overcoat film 126 may have any suitable thickness.

Figure 1I:
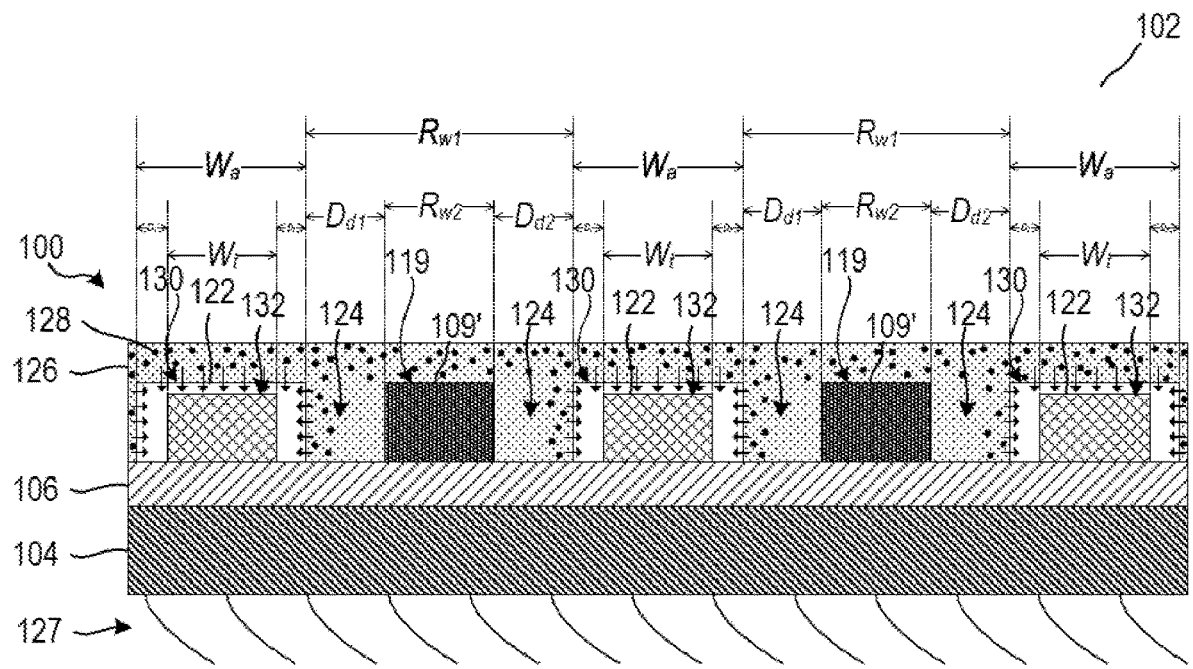
Figure 1I:
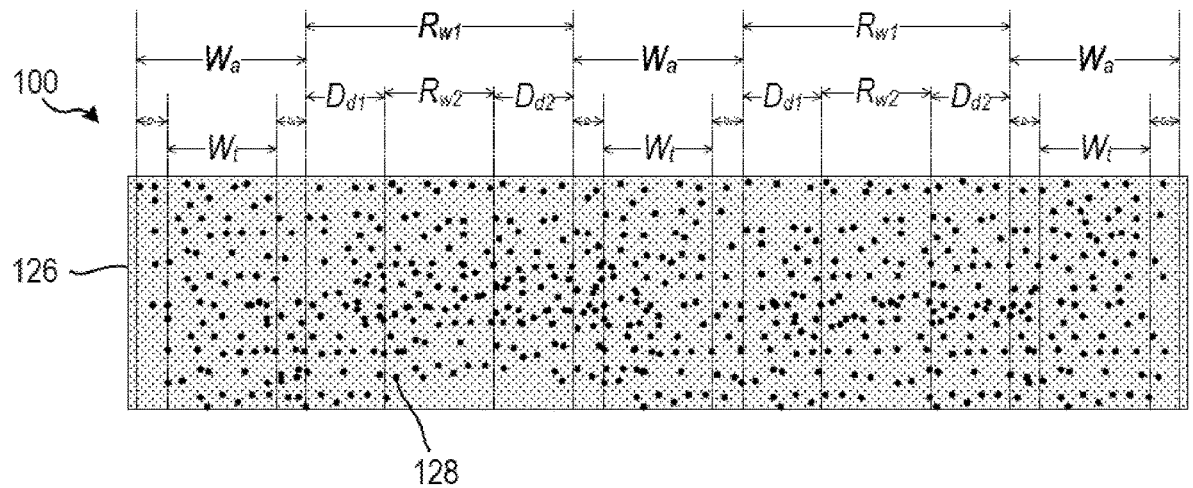

As shown in FIG. 1I, a bake 127 of semiconductor workpiece 100 may be performed. Baking semiconductor workpiece 100 may cause a solubility-changing agent 128 (e.g., acid) to diffuse into portions of overcoat structures 122 and to cause those portions of overcoat structures 122 to become soluble in a developer.

For example, if overcoat film 126 includes a free acid, solubility-changing agent 128 may be the free acid and baking semiconductor workpiece 100 may cause solubility-changing agent 128 (e.g., acid) to diffuse into portions of overcoat structures 122 and to cause those portions of overcoat structures 122 to become soluble in a developer.

As another example, if overcoat film 126 includes a TAG as an agent-generating ingredient, baking semiconductor workpiece 100 may cause the TAG to generate solubility-changing agent 128 (e.g., acid), which may be referred to as activating the acid, cause the generated solubility-changing agent 128 (e.g., acid) to diffuse into portions of overcoat structures 122, and cause those portions of overcoat structures 122 to become soluble in a developer.

As another example, if overcoat film 126 includes a PAG as an agent-generating ingredient, overcoat film 126 may be exposed to radiation prior to baking semiconductor workpiece 100 (e.g., prior to executing bake 127). This exposure step may cause the PAG to generate solubility-changing agent 128 (e.g., acid), which may be referred to as activating the acid. Baking semiconductor workpiece 100 using bake 127 may cause the generated solubility-changing agent 128 (e.g., acid) to diffuse into portions of overcoat structures 122, and cause those portions of overcoat structures 122 to become soluble in a developer.

The exposure suitable for causing the PAG to generate solubility-changing agent 128 may be a flood exposure or may be more similar to the exposure used to form photoresist structures 109 in FIG. 1A. In the case of a flood exposure, it may be possible to perform the exposure in an on-track module of a track-based lithography system without moving semiconductor workpiece 100 to a stepper for more complex exposure. In the case of a more complex exposure, semiconductor workpiece 100 may be moved to a stepper for exposure and then returned to the track. The exposure step may be performed in any suitable manner.

Of course, this disclosure contemplates including other suitable types of agent-generating ingredients that generate solubility-changing agent 128 in response to a suitable activation trigger (e.g., heat, radiation, or another suitable trigger), if appropriate.

Baking semiconductor structures 100 generally causes solubility-changing agent 128 to diffuse into perimeter regions of overcoat structures 122 to a target depth, and to modify that perimeter region to be soluble in a developer, forming soluble portions 130 of overcoat structures 122. For example, the modified perimeter regions (soluble portions 130) may form a deprotected/soluble shell-like structure around overcoat structures 122, consuming a portion of an outer perimeter of overcoat structures 122 and thereby reducing both a vertical and lateral dimension of overcoat structures 122. Among other factors, baking time and/or temperature may be optimized to control a depth of diffusion of solubility-changing agent 128 to achieve the target depth. The depth of diffusion of solubility-changing agent 128 into overcoat structures 122 may be the same or different in the vertical and lateral dimensions. Insoluble portions 132 of overcoat structures 122 remain insoluble in the developer.

In the illustrated example, a lateral depth of diffusion (e.g., on sidewall surfaces of overcoat structures 122) of solubility-changing agent 128 into overcoat structures 122 is shown as $D_1$ and $D_2$ (the overage amount of recesses 110 in FIG. 1A, or half the overage amount of recesses 110 on each side of overcoat structures 122) such that a widths ($W_t$) of overcoat structures 122 are reduced by $D_1+D_2$ and insoluble portions 132 of overcoat structures 122 have widths $W_t$ (e.g., the original target width of recesses 110). For example, insoluble portions 132 have a reduced width, shown as W e, relative to the width W a of overcoat structures 122, and a difference between W a and $W_t$ represents a depth of diffusion ($D_1+D_2$) of solubility-changing agent 128 and soluble portions 130, at least in a lateral dimension. In certain embodiments, the depth of diffusion, and resulting change in solubility of soluble portion 130, is approximately equal on all sides of overcoat structures 122. The lateral depth of diffusion of solubility-changing agent 128 into overcoat structures 122 ($D_1$ and $D_2$) could also be referred to as a lateral thickness of soluble portions 130. Soluble portions 130 also include a vertical component, which may be any suitable amount according to particular implementations. In other words, solubility-changing agent 128 may diffuse by a vertical depth of diffusion into overcoat structures 122 (e.g., on top surfaces of overcoat structures 122) such that heights of overcoat structures 122 are reduced to a height of insoluble portions 132.

As described above, in certain embodiments, solubility-changing agent 128 also may diffuse into portions of photoresist structures 109' to further reduce a later dimension (and/or potentially a vertical dimension) of photoresist structures 109', modifying the portions of photoresist structures 109' into which solubility-changing agent 128 diffuses soluble for development. To the extent patterning process 102 is designed for solubility-changing agent 128 to diffuse into portions of photoresist structures 109', an adjustment may be made to the target diffusion amount of solubility-changing agent 117 into photoresist structures 109 (as illustrated in FIG. 1C) to account for this additional diffusion so that a final width of photoresist structures 109' and recesses 124 equal a target amount.

For the particular example described in connection with FIGS. 1A-1J, at the state illustrated in FIG. 1I, a depth of diffusion of solubility-changing agent 128 into overcoat structures 122 (e.g., a width of soluble portions 130) may be 12.5 nm on each side of overcoat structures 122 to thereby reduce a width of overcoat structures 122 by the overage amount $(D_1+D_2)$ of 25 nm.

In certain embodiments, bake 127 may be performed by heating semiconductor workpiece 100 in a process chamber at a temperature between 50° C. to 250° C., for example between 60° C. to 120° C. in certain embodiments, in vacuum or under a gas flow. In a particular example, semiconductor workpiece 100 is baked for 1 to 3 minutes. The bake conditions of bake 127 may be selected to promote the diffusion of solubility-changing agent 128 (and possibly generation of the solubility-changing agent 128 from an agent-generating ingredient of overcoat film 126, if applicable) and associated change in solubility of a perimeter of overcoat structures 122 to the target depth. This disclosure contemplates executing bake 127 in any suitable manner.

Figure 1J:
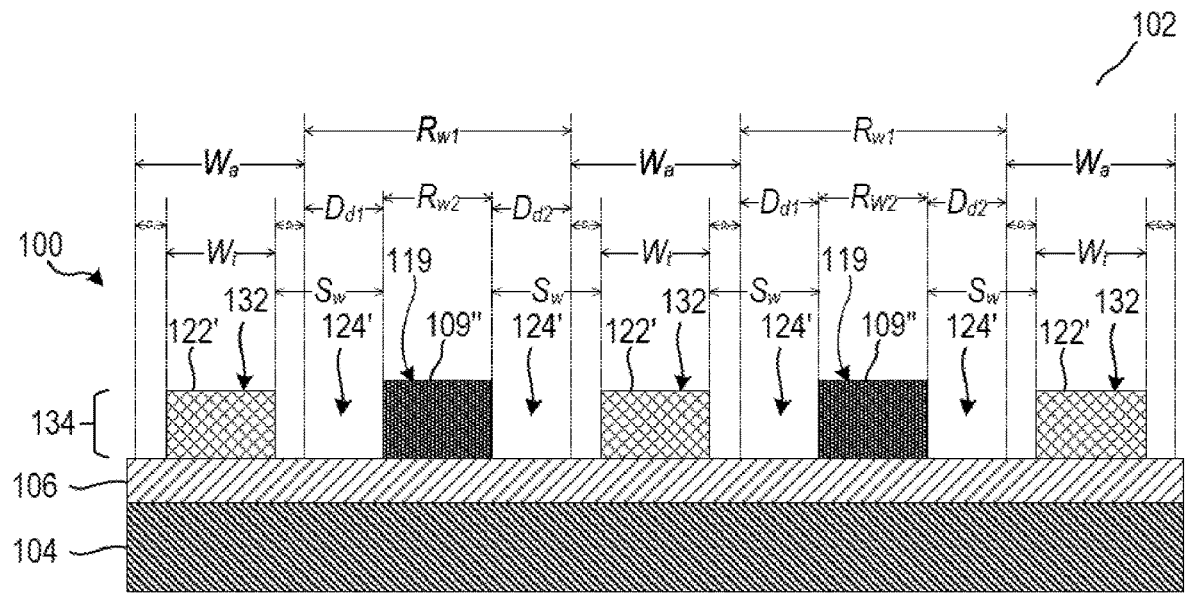
Figure 1J:
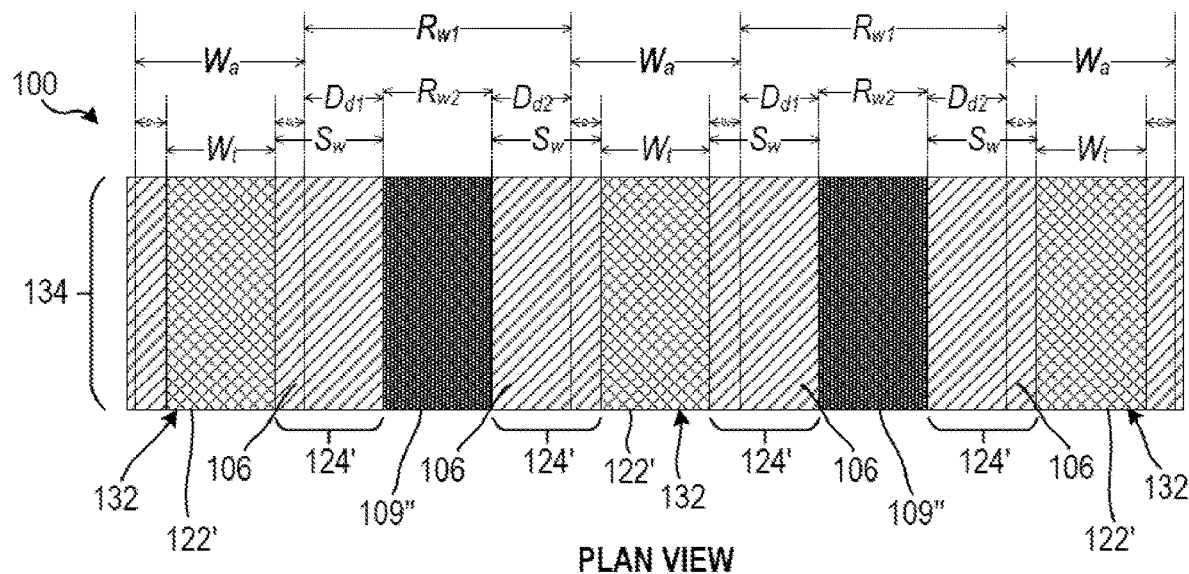

As illustrated in FIG. 1J, overcoat film 126 and soluble portions 130 of overcoat structures 122 may be removed selectively to reveal patterned features 134. Patterned features 134 may include photoresist structures 109'', overcoat structures 122' (insoluble portions 132 of overcoat structures 122), and recesses 124'. To the extent portions of photoresist structures 109' were modified via diffusion of solubility-changing agent 128 in FIG. 1I, those modified portions of photoresist structures 109' also may be removed selectively to reveal photoresist structures 109''. This disclosure contemplates removing overcoat film 126 and soluble portions 130 of overcoat structures 122 (and, to the extent applicable, modified portions of photoresist structures 109') in any suitable manner. For the remainder of the description of FIG. 1J, this disclosure assumes that no portions of photoresist structures 109' were designed to be modified by solubility-changing agent 128 in FIG. 1I. In certain embodiments, overcoat film 126 and soluble portions 130 of overcoat structures 122 are removed selectively using a developer.

In certain embodiments, overcoat film 126 and soluble portions 130 of overcoat structures 122 are removed selectively in a wet process by treating semiconductor workpiece 100 with a developer solution to dissolve selectively overcoat film 126 and soluble portions 130 of overcoat structures 122. The appropriate developer solution for selectively removing overcoat film 126 and soluble portions 130 of overcoat structures 122 depends in part on the material of overcoat film 126 and soluble portions 130 of overcoat structures 122. In certain embodiments, the developer solution may include an aqueous alkaline solution that includes a water-soluble organic base. As particular examples, the developer solution may include TMAH.

Alternatively, a dry process may be used in other embodiments. The dry process may include, for example, a selective plasma etch process or a thermal process, which may eliminate the use of a developing solution. In certain embodiments, the dry process may be performed using an RIE process or an ALE process.

Removing overcoat film 126 and soluble portions 130 of overcoat structures 122 forms patterned structures 122' from insoluble portions 132 of overcoat structures 122 (remaining portions of overcoat structures 122) and re-reveals photoresist structures 109' (labeled as photoresist structures 109'' to the extent portions of photoresist structures 109' also may be solubilized and removed at FIGS. 1I and 1J). Removing soluble portions 130 of overcoat structures 122 to form overcoat structures 122' reduces a width of overcoat structures 122 from $W_a$ (of overcoat structures 122) to target width $W_t$ (of overcoat structures 122').

Removing soluble portions 130 of overcoat structures 122 reveals recesses 124' defined by overcoat structures 122' and photoresist structures 109''. Recesses 124' have a width $D_2+D_{d1}$ (or $D_1+D_{d2}$), shown as width $S_w$. For example, removing soluble portions 130 of overcoat structures 122 expands a width of recesses 124 from a width $D_{d1}$ (or $D_{d2}$) (of recesses 124) to a width $D_2+D_{d1}$ (or $D_1+D_{d2}$) (of recesses 124'), which may be the target width for recesses 124'.

Thus, at the state illustrated in FIG. 1J, patterned features 134, including photoresist structures 109'', overcoat structures 122', and recesses 124' have reached respective target widths. Those respective target widths are sub-resolution widths relative to feature widths that may be directly achieved with the lithography technology used to form patterned features 108 in FIG. 1A. Additionally, in this example, a feature pitch that might be accomplished using a standard anti-spacer patterning process has been reduced, thereby increasing a feature density of semiconductor workpiece 100. In the illustrated example, a feature pitch for a line-space-line-space pattern is 1:1:1:1; however, this disclosure contemplates other feature pitches.

For the particular example described in connection with FIGS. 1A-1J, at the state illustrated in FIG. 1J, widths of photoresist structures 109'', widths of overcoat structures 122', and widths of recesses 124' are 45 nm, and a feature pitch for a line(photoresist structure 109'')-space(recess 124')-line(overcoat structure 122')-space (recess 124') pattern is 1:1:1:1.

Having described the partial development of overcoat film 120 in FIG. 1F (to form overcoat structures 122), the conversion of overcoat structures 122 to be insoluble in a developer in FIG. 1G, the conversion of portions of overcoat structures 122 to be soluble for development in FIG. 1I, and the development of those soluble portions of overcoat structures 122 in FIG. 1J, one can understand that, in certain embodiments, overcoat film 120 has a switchable solubility for a developer solution that may be activated by a diffusible solubility-changing agent. For example, overcoat film 120 may include polymer resin to facilitate this switchable solubility.

In certain embodiments, the polymer resin may be designed with the following characteristics: 1) a low minimum development rate ($R_{min}$) in the developer to reveal recesses 124 in FIG. 1F (e.g., the anti-spacer trenches) and thereby allow for a controlled recess of overcoat film 120; 2) the polymer resin is functionalized such that a thermally-activated or photo-activated reaction prevents or otherwise inhibits dissolution of overcoat film 120 in a casting solvent for depositing overcoat film 126 (FIG. 1H) or dissolution in a developer for forming patterned features 134 (FIG. 1J); and 3) diffusion of a reactive species (solubility-changing agent 128, such as acid) into the polymer resin causes a solubility shift resulting in the reacted resin having a high $R_{min}$ in the developer solvent. As described above, in certain embodiments, the crosslinking of overcoat film 120 (e.g., overcoat structures 122) may be thermally initiated for the sake of throughput/cost (e.g., FIG. 1G), and the decrosslinking (solubilization) mechanism may occur through reaction with a strong acid (e.g., FIG. 1I), such as a free acid, an acid generated from a TAG, or an acid generated from a PAG.

Additionally, returning to the diffusion of solubility-changing agent 117 into photoresist structures 109 (FIG. 1C), a target amount of lateral diffusion for a given implementation may depend on whether a solubility-changing agent 128 (with associated process conditions) is designed to diffuse into photoresist structures 109' (FIG. 1I) such that widths of photoresist structures 109' will undergo a further width adjustment at the stages illustrated in FIGS. 1I-1J, or if instead solubility-changing agent 128 (with associated process conditions) is designed to diffuse selectively into overcoat structures 122 such that a width of photoresist structures 109 is designed to be reduced to a final target width at the stages illustrated in FIGS. 1C-1F.

If, in addition to diffusing into overcoat structures 122, solubility-changing agent 128 (with associated process conditions) is designed to diffuse laterally into photoresist structures 109' (FIG. 1I) such that widths of photoresist structures 109' will undergo a further width adjustment at the stages illustrated in FIGS. 1I-1J, then a target depth of lateral diffusion of solubility-changing agent 117 into photoresist structures 109 at FIG. 1C may be calculated as: $D_d=(R_{w1}-R_{wt})/2-D_{sd}$, where $D_d$ is the depth of diffusion (whether $D_{d1}$ or $D_{d2}$) being determined for solubility-changing agent 117 into photoresist structures 109 at FIG. 1C, $R_{wt}$ is the target width for photoresist structures 109" at FIG. 1J, and $D_{sd}$ is the depth of expected subsequent diffusion of solubility-changing agent 128 (with associated process conditions) into photoresist structures 109' (FIG. 1I), the remaining variables being as previously described. To the extent a 1:1:1:1 feature pitch is targeted, the above formula could be written as $D_d=T_{CD}-((D_1+D_2)/2+D_{sd})$, where $T_{CD}$ is the target CD of patterned features 134.

For the particular example described in connection with FIGS. 1A-1J, assuming as just an example that a value of $D_{sd}$ is 20 nm (e.g., based on an assumption that a diffusion rate associated with diffusion of solubility-changing agent 128 into both overcoat structures 122 and photoresist structures 109' is the same), then a value of $D_d$ is 20 nm (either ((110 nm-45 nm)/2-12.5 nm) or (45 nm-(12.5 nm+12.5 nm)/2+12.5 nm)).

If, on the other hand, solubility-changing agent 128 (with associated process conditions) is designed to diffuse selectively into overcoat structures 122 such that a width of photoresist structures 109 is designed to be reduced to a final target width (for photoresist structures 109") at the stages illustrated in FIGS. 1C-1F, then a target depth of lateral diffusion of solubility-changing agent 117 into photoresist structures 109 at FIG. 1C may be calculated as: $D_d=(R_{w1}-R_{wt})/2$, where $D_d$ is the depth of diffusion (whether $D_{d1}$ or $D_{d2}$) being determined for solubility-changing agent 117 into photoresist structures 109 at FIG. 1C and $R_{wt}$ is the target width for photoresist structures 109" at FIG. 1J, the remaining variables being as previously described. To the extent a 1:1:1:1 feature pitch is targeted, the above formula could be written as $D_d=T_{CD}-((D_1+D_2)/2)$, where $T_{CD}$ is the target CD of patterned features 134.

For the particular example described in connection with FIGS. 1A-1J, then a value of $D_d$ is 32.5 nm (either ((110 nm-45 nm)/2) or (45 nm-12.5 nm)).

In the state illustrated in FIG. 1J, patterned features 134 define a pattern that can be transferred to an underlying layer (e.g., intermediate layer 106). Additionally, when the pattern of patterned features 134 is transferred to the underlying layer, the improved characteristics of patterned features 134, including potentially sub-resolution features with a reduced or minimized pitch ratio, also may be propagated to the underlying layer.

Figure 1K:
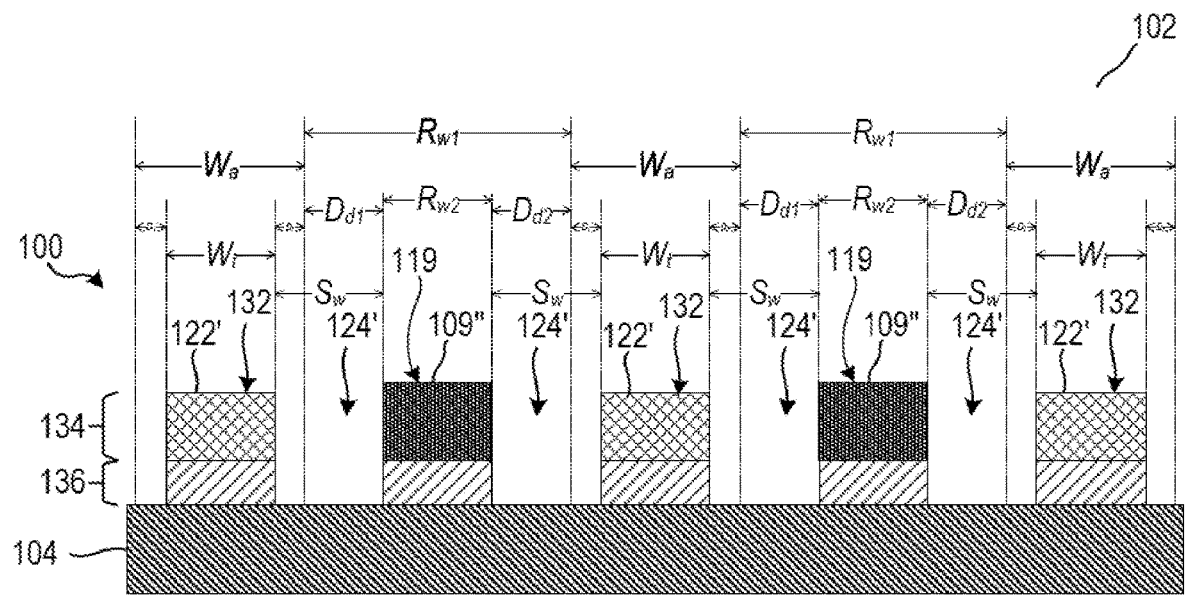
Figure 1K:
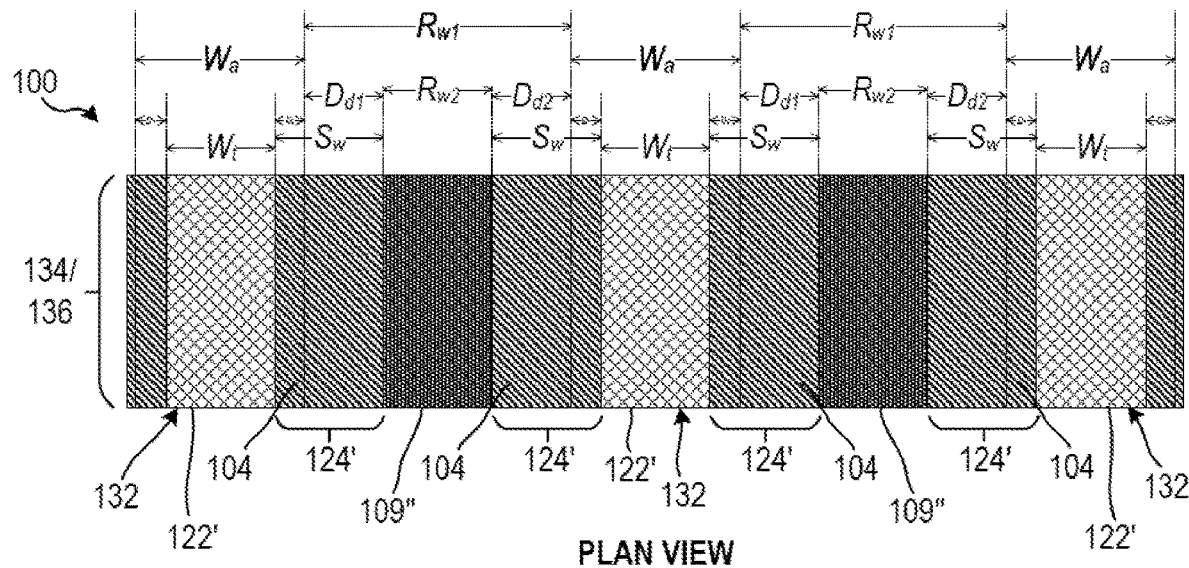

As illustrated in FIG. 1K, the pattern defined by the combination of overcoat structures 122', photoresist structures 109", and recesses 124' (collectively, patterned features 134) may be transferred to an underlying layer, such as some or all of intermediate layer 106, thereby potentially transferring the sub-resolution feature widths and feature pitch of the patterned defined by the combination of overcoat structures 122', photoresist structures 109", and recesses 124' to the underlying layer. This pattern transfer may be performed using any suitable combination of etch processes, including any suitable wet etch process and dry etch processes. For example, the etch process may include one or more of aa liquid etch, a chemical wet etch, a chemical dry etch, a plasma etch, an atomic layer etch, or other suitable etch process. In the illustrated example, transferring the pattern defined by overcoat structures 122', photoresist structures 109", and recesses 124' to intermediate layer 106 includes extending recesses 124' into intermediate layer 106.

Although the above-described example of patterning process 102 has been described primarily with an example in which line and pitch widths of 45 nm, along with a pitch ratio of 1:1:1:1, are targeted, this disclosure contemplates targeting any suitable line and pitch widths with any suitable pitch ratio.

For brevity and clarity, this description adopts a convention in which elements adhering to the pattern [x02] may be related implementations of a process and/or semiconductor workpiece in certain embodiments. For example, except as otherwise stated or readily apparent, semiconductor workpiece 200 may be similar to semiconductor workpiece 100, substrate 204 may be similar to substrate 104, and the like. An analogous convention has also been adopted for other elements as made clear by the use of similar terms in conjunction with the described three-digit numbering system. Through this convention, where applicable, features that have already been described are incorporated by reference without being repeated.

FIG. 2 illustrates a plan view of an example semiconductor workpiece 200 during an example patterning process (e.g., at the state illustrated in FIG. 1J), according to certain embodiments. While recesses 124' in FIG. 1J extend an entire length of overcoat structures 122' and photoresist structures 109", with semiconductor workpiece 200, recesses 224' extend only a partial length of overcoat structures 222' and photoresist structures 109". For example, overcoat structures 222' and photoresist structures 209" have a line length Li and recesses 124' have a length Si (referring to space length), with Si being less than Li. In one example, recesses 224' could be used to form slot contacts within a semiconductor device. Additionally, while recesses 124' in FIG. 1J extend an entire length of overcoat structures 122' and photoresist structures 109", a cross-sectional view of semiconductor workpiece 200 taken along line A-A' may appear similar or identical to the cross-sectional view of semiconductor workpiece 100 in FIG. 1J.

Figure 3:
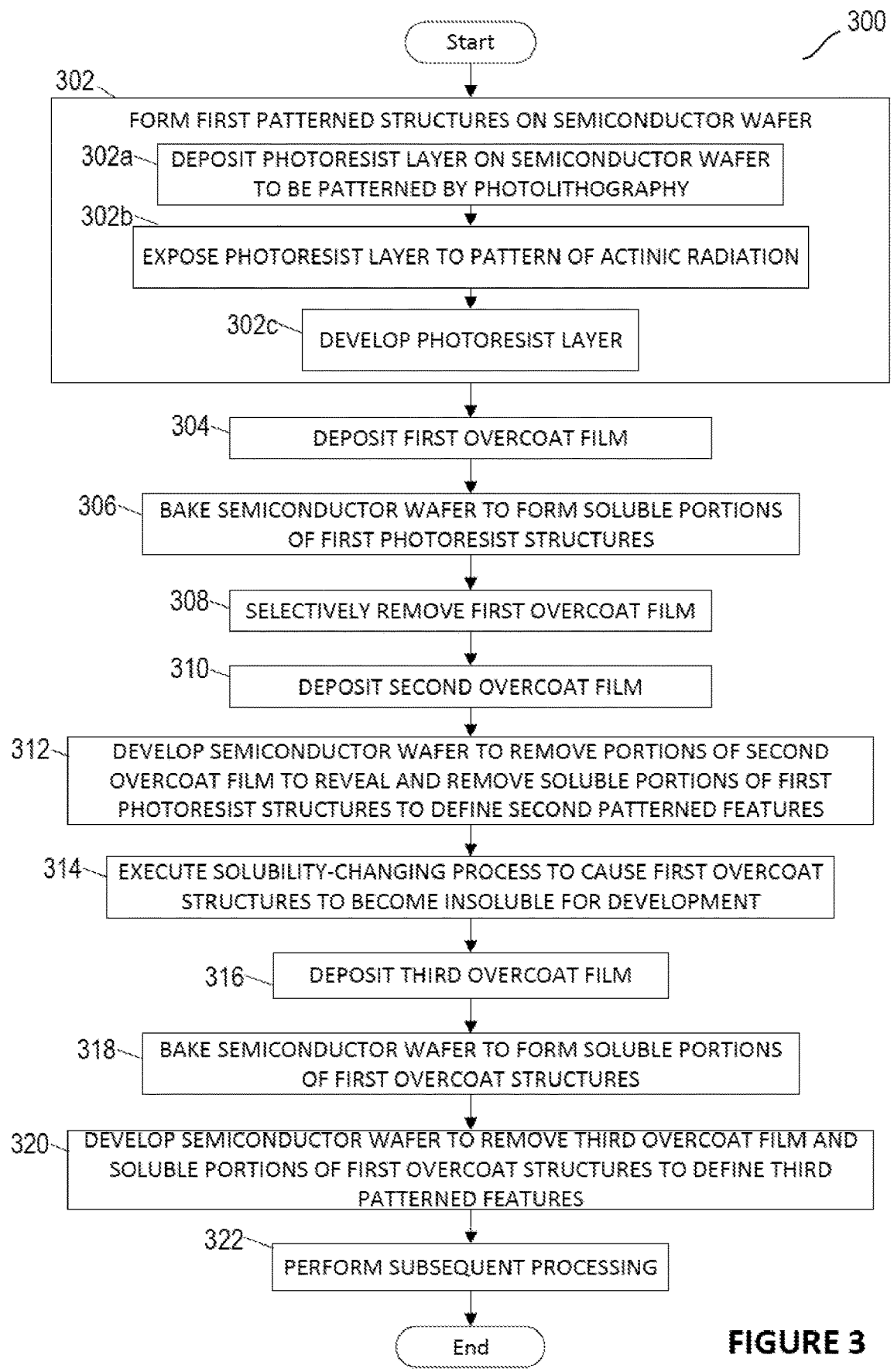
FIG. 3 illustrates an example method for patterning a semiconductor workpiece, according to certain embodiments.

FIG. 3 illustrates an example method 300 for patterning a semiconductor workpiece, according to certain embodiments. Method 300 may be analogous to portions or all of patterning process 102, and for purposes of describing example method 300, reference is made primarily to the reference numerals used in connection with FIGS. 1A-1K. Method 300 also could be used to form a structure similar to semiconductor workpiece 200 of FIG. 2. Furthermore, aspects of at least FIGS. 1A-1K and 2 not described in connection with FIG. 3 are incorporated by reference. Method 300, however, may implement any suitable patterning process.

At step 302, patterned features 108 are formed from a photoresist layer of a semiconductor workpiece 100. Patterned features 108 may include photoresist structures 109 formed from the photoresist layer and recesses 110 defined by photoresist structures 109. In certain embodiments, forming patterned features 108 includes at step 302(a) depositing the photoresist layer on a semiconductor wafer (semiconductor workpiece 100) to be patterned by photolithography, at step 302(b) exposing the photoresist layer to a pattern of actinic radiation, and at step 302(c) developing the photoresist layer. Following development, remaining portions of the photoresist layer form photoresist structures 109, which define recesses 110.

In certain embodiments, a photolithography technology for exposing the photoresist layer to the pattern of actinic radiation includes dry lithography (e.g., using 193 dry lithography), immersion lithography (e.g., using 193 nanometer immersion lithography), i-line lithography (e.g., using 365 nanometer wavelength UV radiation for exposure), H-line lithography (e.g., using 405 nanometer wavelength UV radiation for exposure), EUV lithography, DUV lithography, or any suitable photolithography technology. Additionally, the photolithography technology may be mask-based (e.g., projection lithography), maskless (e.g., e-beam lithography), or another suitable type of lithography.

Recesses 110 may have actual widths ($W_a$) that are greater than a target width ($W_t$). The actual widths ($W_a$) may be determined according to a photolithography technology used to form patterned features 108. The actual widths ($W_a$) may exceed the target width ($W_t$) due at least in part to limitations resulting from a wavelength of the photolithography used to for patterned features 108.

At step 304, overcoat film 112 is deposited on semiconductor workpiece 100. Overcoat film 112 fills recesses 110 and covers photoresist structures 109. In certain embodiments, depositing overcoat film 112 on semiconductor workpiece 100 includes depositing a material of overcoat film 112 by spin-coating (e.g., using spin-on deposition technique 114) the material of overcoat film 112 on semiconductor workpiece 100 such that overcoat film 112 fills recesses 110 and covers photoresist structures 109.

At step 306, semiconductor workpiece 100 may be baked to form soluble portions 118 of photoresist structures 109. In certain embodiments, baking semiconductor workpiece 100 to form soluble portions 118 of photoresist structures 109 includes a solubility-changing agent 117 diffusing, in response to heat associated with baking semiconductor workpiece 100, from overcoat film 112 to perimeter portions of photoresist structures 109. Solubility-changing agent 177 may modify the perimeter portions of photoresist structures 109 to become soluble for development, thereby forming soluble portions 118 of photoresist structures 109.

In certain embodiments, solubility-changing agent 117 includes acid and photoresist structures 109 include an acid-reactive material. In certain embodiments, overcoat film 112 includes a polymer and, as deposited, an agent-generating ingredient for generating solubility-changing agent 117. For example, the agent-generating ingredient may include a TAG or a PAG. In certain embodiments, the agent-generating ingredient includes a PAG and method 300 further includes exposing, prior to baking semiconductor workpiece 100 at step 306 to form soluble portions 118 of photoresist structures 109, overcoat film 112 to actinic radiation to cause the PAG in overcoat film 112 to generate solubility-changing agent 117.

In certain embodiments, baking semiconductor workpiece 100 to form soluble portions 118 of photoresist structures 109 causes solubility-changing agent 117 to diffuse from overcoat film 112 to perimeter portions of photoresist structures 109 up to a target depth. The target depth may be less than or equal to one half of a difference between the first width (e.g., actual width $W_a$) and the target width ($W_t$). In embodiments in which a width of photoresist structures 109' is designed to equal a width of photoresist structures 109', to be formed at steps 312 and 320, respectively, the target depth may be equal to one half of a difference between the first width (e.g., actual width $W_a$) and the target width ($W_t$).

At step 308, overcoat film 112 may be selectively removed.

At step 310, overcoat film 120 may be deposited on semiconductor workpiece 100. Overcoat film 120 fills recesses 110 and covers photoresist structures 109. In certain embodiments, depositing overcoat film 120 on semiconductor workpiece 100 includes depositing a material of overcoat film 120 by spin-coating (e.g., using spin-on deposition technique 114) the material of overcoat film 120 on semiconductor workpiece 100 such that overcoat film 120 fills recesses 110 and covers photoresist structures 109.

At step 312, semiconductor workpiece 100 is developed to remove portions of overcoat film 120 to reveal and remove soluble portions 118 of photoresist structures 109 to define patterned features 123 that include photoresist structures 108', overcoat structures 122 interspersed between photoresist structures 109', and recesses 124 defined by photoresist structures 109' and overcoat structures 122.

At step 314, a solubility-changing process is executed to cause overcoat structures 122 to become insoluble for development. In certain embodiments, executing the solubility-changing process to cause overcoat structures 122 to become insoluble for development includes baking semiconductor workpiece 100. A temperature for baking semiconductor workpiece 100 to cause overcoat structures 122 to become insoluble for development is greater than a temperature for baking semiconductor workpiece 100 to form soluble portions 118 of photoresist structures 109. In certain embodiments, prior to executing the solubility-changing process at step 314 to cause overcoat structures 122 to become insoluble for development, overcoat film 120 is soluble at a first removal rate in a developer used for developing semiconductor workpiece at step 312 to remove the portions of overcoat film 120 to reveal and remove soluble portions 118 of photoresist structures 109. Soluble portions 118 of photoresist structures 109 may be soluble at a second removal rate in the developer, the second removal rate being greater than the first removal rate, potentially by a significant amount as described above.

In certain embodiments, executing the solubility-changing process to cause overcoat structures 122 to become insoluble for development includes exposing overcoat structures 122 to actinic radiation.

In certain embodiments, overcoat film 120 includes a polymer and the solubility-changing process causes polymer crosslinking to occur in overcoat structures 122 (made of the material of overcoat film 120). The polymer crosslinking may render overcoat structures 122 insoluble in a developer for developing semiconductor workpiece to remove an overcoat film 126 and soluble portions 130 of overcoat structures 122 in a subsequent step (see step 320).

At step 316, overcoat film 126 may be deposited on semiconductor workpiece 100. Overcoat film 126 fills recesses 124 and covers photoresist structures 109' and overcoat structures 122. In certain embodiments, depositing overcoat film 126 on semiconductor workpiece 100 includes depositing a material of overcoat film 126 by spin-coating (e.g., using spin-on deposition technique 114) the material of overcoat film 126 on semiconductor workpiece 100 such that overcoat film 126 fills recesses 124 and covers photoresist structures 109' and overcoat structures 122.

At step 318, semiconductor workpiece 100 is baked to form soluble portions 130 of overcoat structures 122. In certain embodiments, baking, subsequent to the polymer crosslinking of step 314, semiconductor workpiece 100 to form soluble portions 130 of overcoat structures 122 causes perimeter portions to a target depth of overcoat structures 122 to become soluble for development in a developer for developing semiconductor workpiece to remove overcoat film 126 and soluble portions 130 of overcoat structures 122.

In certain embodiments, baking semiconductor workpiece 100 to form soluble portions 130 of overcoat structures 122 includes a solubility-changing agent 128 diffusing, in response to heat associated with baking semiconductor workpiece 100, from overcoat film 126 to perimeter portions of overcoat structures 122. Solubility-changing agent 128 may modify the perimeter portions of overcoat structures 122 to become soluble for development, thereby forming soluble portions 130 of overcoat structures 122.

In certain embodiments, solubility-changing agent 128 includes acid and overcoat structures 122 include an acid-reactive material. In certain embodiments, overcoat film 126 includes a polymer and, as deposited, an agent-generating ingredient for generating solubility-changing agent 128. For example, the agent-generating ingredient may include a TAG or a PAG.

In an example in which the agent-generating ingredient includes a PAG, method 300 may further include exposing, prior to baking semiconductor workpiece 100 at step 318 to form soluble portions 130 of overcoat structures 122, overcoat film 126 to actinic radiation to cause the PAG in overcoat film 126 to generate solubility-changing agent 128.

In certain embodiments, baking semiconductor workpiece 100 to form soluble portions 130 of overcoat structures 122 causes solubility-changing agent 128 to diffuse from overcoat film 126 to perimeter portions of overcoat structures 122 up to a target depth. The target depth may be less than or equal to one half of a difference between the first width (e.g., actual width $W_a$) and the target width ($W_t$).

In certain embodiments, portions of photoresist structures 109' are solubilized and developed at steps 318 and 320, depending on how removal of certain portions of photoresist structures 109 was biased at steps 306 (diffusion of solubility-changing agent 117 into photoresist structures 109/depth of soluble portions 118) and 312 (development to remove soluble portions 118 of photoresist structures 109). In such an example, baking semiconductor workpiece 100 at step 318 to form soluble portions 130 of overcoat structures 122 further forms soluble portions of photoresist structures 109' (e.g., by diffusing solubility-changing agent 128 overcoat film 126 into photoresist structures 109' to form the soluble portions of photoresist structures 109') and developing semiconductor workpiece 100 at step 320 (described below) to remove overcoat film 126 and soluble portions 130 of overcoat structures 122 further removes the soluble portions of photoresist structures 109' to define photoresist structures 109''. In such an example, the target depth of diffusion of solubility-changing agent 128 from overcoat film 126 to perimeter portions of overcoat structures 122 may be less than one half of a difference between the first width and the target width, and a width of photoresist structures 109'' may be less than a width of photoresist structures 109' once developed at step 320.

In certain embodiments, the first widths (e.g., actual width WO exceed the target width ($W_t$) by an overage amount ($D_1+D_2$).

In one example, photoresist structures 109' and photoresist structures 109'' have a same width, meaning that photoresist structures 109' are not further solubilized and developed at steps 318 and 320, respectively. In such an example, baking semiconductor workpiece 100 to form soluble portions 118 of photoresist structures 109 causes solubility-changing agent 117 to diffuse from overcoat film 112 to the perimeter portions of photoresist structures 109 up to a first diffusion depth, and the second photoresist structures and the third photoresist structures have a same width, and the first diffusion depth may equal the target width ($W_t$) minus half the overage amount ($D_1+D_2$).

In another example, baking semiconductor workpiece 100 to form soluble portions 118 of photoresist structures 109 may cause solubility-changing agent 117 to diffuse from overcoat film 112 to perimeter portions of photoresist structures 109 up to a first diffusion depth. Additionally, in such an example, baking semiconductor workpiece 100 to form soluble portions 130 of overcoat structures 122 may diffuse solubility-changing agent 128 of overcoat film 126 into perimeter portions of overcoat structures 122 by a second diffusion depth. Additionally, in such an example, baking semiconductor workpiece 100 to form soluble portions 130 of overcoat structures 122 further diffuses solubility-changing agent 128 of overcoat film 126 to perimeter portions of photoresist structures 109' up to a third diffusion depth to form the soluble portions of photoresist structures 109'. The second and third diffusion depths might or might not be the same. In such an example, the first diffusion depth may equal the target width ($W_t$) minus half the overage amount ($D_1+D_2$) plus a total of the first and second diffusion depths.

At step 320, semiconductor workpiece 100 is developed to remove overcoat film 126 and soluble portions 130 of overcoat structures 122 to define patterned features 134. Patterned features 134 include photoresist structures 109'', overcoat structures 122' interspersed between photoresist structures 109'', and recesses 124' defined by overcoat structures 122' and photoresist structures 109''. Overcoat structures 122' may have the target width ($W_t$). In certain embodiments, widths of patterned features 134 are equal and below a resolution capability of a photolithography technology used to form patterned features 108.

At step 322, subsequent processing may be performed. For example, patterned features 134 of semiconductor workpiece 100 may be used to form sub-resolution features in an underlying layer (e.g., intermediate layer 106) of semiconductor workpiece 100.

Method 300 may then end.

Figure 4:
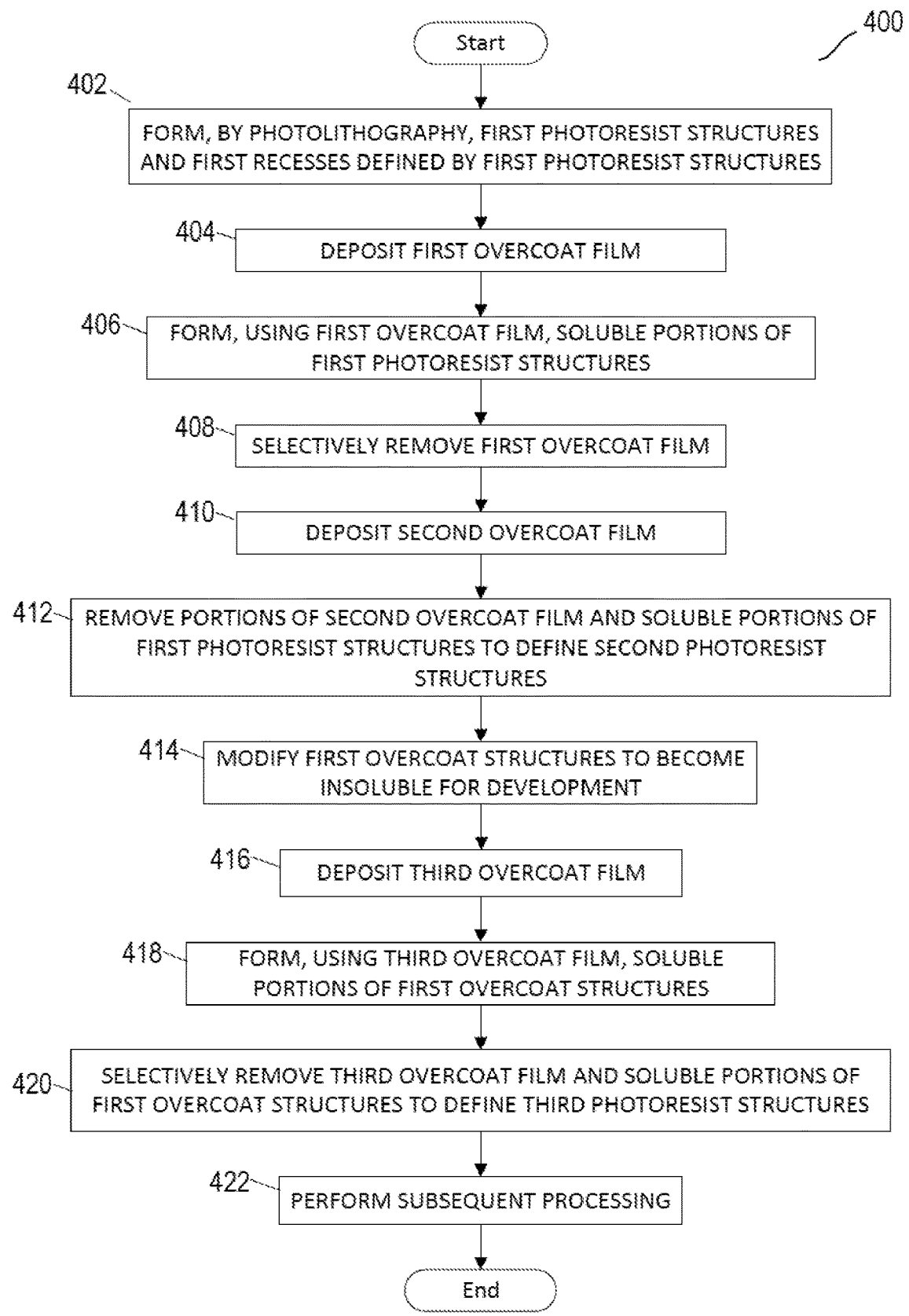
FIG. 4 illustrates an example method for patterning a semiconductor workpiece, according to certain embodiments.

FIG. 4 illustrates an example method 400 for patterning a semiconductor workpiece, according to certain embodiments. Method 400 may be analogous to portions or all of patterning process 102, and for purposes of describing example method 400, reference is made primarily to the reference numerals used in connection with FIGS. 1A-1K. Method 400 also could be used to form a structure similar to semiconductor workpiece 200 of FIG. 2. Furthermore, aspects of at least FIGS. 1A-1K and 2 not described in connection with FIG. 4 are incorporated by reference. Method 400, however, may implement any suitable patterning process.

At step 402, photoresist structures 109 and recesses 110 may be formed on a semiconductor wafer (e.g., semiconductor workpiece 100) by photolithography. For example, photoresist structures 109 and recesses 110 may be patterned from a photoresist layer formed on semiconductor workpiece 100.

Photoresist structures 109 may have widths $R_{w1}$. Recesses 110 may have actual widths ($W_a$) that are greater than a target width ($W_t$). The actual widths ($W_a$) may be determined according to a photolithography technology used to form patterned features 108. The actual widths ($W_a$) may exceed the target width ($W_t$) due at least in part to limitations resulting from a wavelength of the photolithography used to for patterned features 108. That is, a minimum achievable width for actual width $W_a$ is determined according to a photolithography technology used for the photolithography.

At step 404, overcoat film 112 is deposited on semiconductor workpiece 100. Overcoat film 112 fills recesses 110 and covers photoresist structures 109. In certain embodiments, depositing overcoat film 112 on semiconductor workpiece 100 includes depositing a material of overcoat film 112 by spin-coating (e.g., using spin-on deposition technique 114) the material of overcoat film 112 on semiconductor workpiece 100 such that overcoat film 112 fills recesses 110 and covers photoresist structures 109.

At step 406, using overcoat film 112, soluble portions 118 of photoresist structures 109 may be formed. For example, soluble portions 118 of photoresist structures 109 may be formed using a suitable combination of exposing semiconductor workpiece 100 to actinic radiation and/or baking semiconductor workpiece 100 to cause a solubility-changing agent 117 (e.g., acid) to diffuse into and solubilize portions of photoresist structures 109 to form soluble portions 118.

At step 408, overcoat film 112 may be selectively removed.

At step 410, overcoat film 120 may be deposited on semiconductor workpiece 100. Overcoat film 120 fills recesses 110 and covers photoresist structures 109. In certain embodiments, depositing overcoat film 120 on semiconductor workpiece 100 includes depositing a material of overcoat film 120 by spin-coating (e.g., using spin-on deposition technique 114) the material of overcoat film 120 on semiconductor workpiece 100 such that overcoat film 120 fills recesses 110 and covers photoresist structures 109.

At step 412, portions of overcoat film 120 and soluble portions 118 of photoresist structures 109 are removed to define photoresist structures 109', overcoat structures 122 of overcoat film 120 and occupying recesses 110, and recesses 124 in regions previously occupied by soluble portions 118 of photoresist structures 109. Photoresist structures 109' have a width $R_{w2}$ that is less than the width $R_{w1}$ of photoresist structures 109. Overcoat structures 122 have the actual width $W_a$ of now-filled recesses 110. Recesses 124 have a width ($D_{d1}$ or $D_{d2}$) that is less than the target width ($W_t$).

At step 414, overcoat structures 122 are modified to become insoluble for development. In certain embodiments, overcoat film 120 includes a polymer resin and modifying overcoat structures 122 to become insoluble for development includes causing, in response to an activation trigger, a polymer crosslinking reaction to occur overcoat film 120 (e.g., overcoat structures 122 formed from overcoat film 120) that renders overcoat film 120 (e.g., overcoat structures 122 formed from overcoat film 120) insoluble for development in a developer used for selectively removing an overcoat film 126 and soluble portions 130 of overcoat structures 122 in a subsequent step of method 400. In certain embodiments, the activation trigger includes heating semiconductor workpiece 100 and/or exposing overcoat film 120 (e.g., overcoat structures 122 formed from overcoat film 120) to actinic radiation.

At step 416, overcoat film 126 may be deposited on semiconductor workpiece 100. Overcoat film 126 fills recesses 124 and covers photoresist structures 109' and overcoat structures 122. In certain embodiments, depositing overcoat film 126 on semiconductor workpiece 100 includes depositing a material of overcoat film 126 by spin-coating (e.g., using spin-on deposition technique 114) the material of overcoat film 126 on semiconductor workpiece 100 such that overcoat film 126 fills recesses 124 and covers photoresist structures 109' and overcoat structures 122.

At step 418, using overcoat film 126, soluble portions 130 of overcoat structures 122 may be formed. For example, soluble portions 130 of overcoat structures 122 may be formed using a suitable combination of exposing semiconductor workpiece 100 to actinic radiation and/or baking semiconductor workpiece 100 to cause a solubility-changing agent 128 (e.g., acid) to diffuse into and solubilize portions of overcoat structures 122 to form soluble portions 130. In certain embodiments, lateral depths of soluble portions 130 of overcoat structures 122 equal one half a difference between the target width $W_t$ and the actual width $W_a$.

At step 420, overcoat film 126 and soluble portions 130 of overcoat structures 122 are selectively removed to define photoresist structures 109", overcoat structures 122' interspersed between photoresist structures 109", and recesses 124' defined by photoresist structures 109" and overcoat structures 122'. Following a width reduction associated with the acid diffusion process of step 506 during which portions of overcoat structures 122 have been selectively removed to form overcoat structures 122', overcoat structures 122' have the target width $W_t$, and recesses 124' have a width ($S_w$), which is greater than a width ($D_{d1}$ or $D_{d2}$) of recesses 124. Width $S_w$ may be the target width ($W_t$).

Photoresist structures 109" may have a width $R_{w2}$, which might be the same or less than the width $R_{w2}$ of photoresist structures 109', depending on whether the acid diffusion process of step 506 further reduces a width of photoresist structures 109' to form photoresist structures 109". In certain embodiments, the width $R_{w2}$ of photoresist structures 109" is the same as the width $R_{w2}$ of photoresist structures 109', and in such an example, a lateral depth of soluble portions 118 of photoresist structures 109 at step 406 equals one half a difference between width $R_{w1}$ of photoresist structures 109 and width $R_{w2}$, of photoresist structures 109'/109". In certain other embodiments, the width $R_{w2}$ of photoresist structures 109" is less than the width $R_{w2}$ of photoresist structures 109', and in such an example, step 418 may further include forming, using overcoat film 126, soluble portions of photoresist structures 109' and step 420 may further include selectively removing, when selectively removing overcoat film 126 and soluble portions 130 of overcoat structures 122, the soluble portions of photoresist structures 109' to define photoresist structures 109". Widths $R_{w2}$ of photoresist structures 109" may equal target width $W_t$.

In certain embodiments, widths $R_{w2}$ of photoresist structures 109" equal target width $W_t$, widths of overcoat structures 122' equal target width $W_t$, and widths $S_w$ of recesses 124' equal target width $W_t$, and a 1:1:1:1 line-space-line-space pitch ratio is defined. In certain embodiments, the target width $W_t$ is less than a minimum achievable width associated with the photolithography technology used at step 402 to form photoresist structures 109 and recesses 110.

At step 422, subsequent processing may be performed. For example, patterned features 134 of semiconductor workpiece 100 may be used to form sub-resolution features in an underlying layer (e.g., intermediate layer 106) of semiconductor workpiece 100.

Method 400 may then end.

Figure 5:
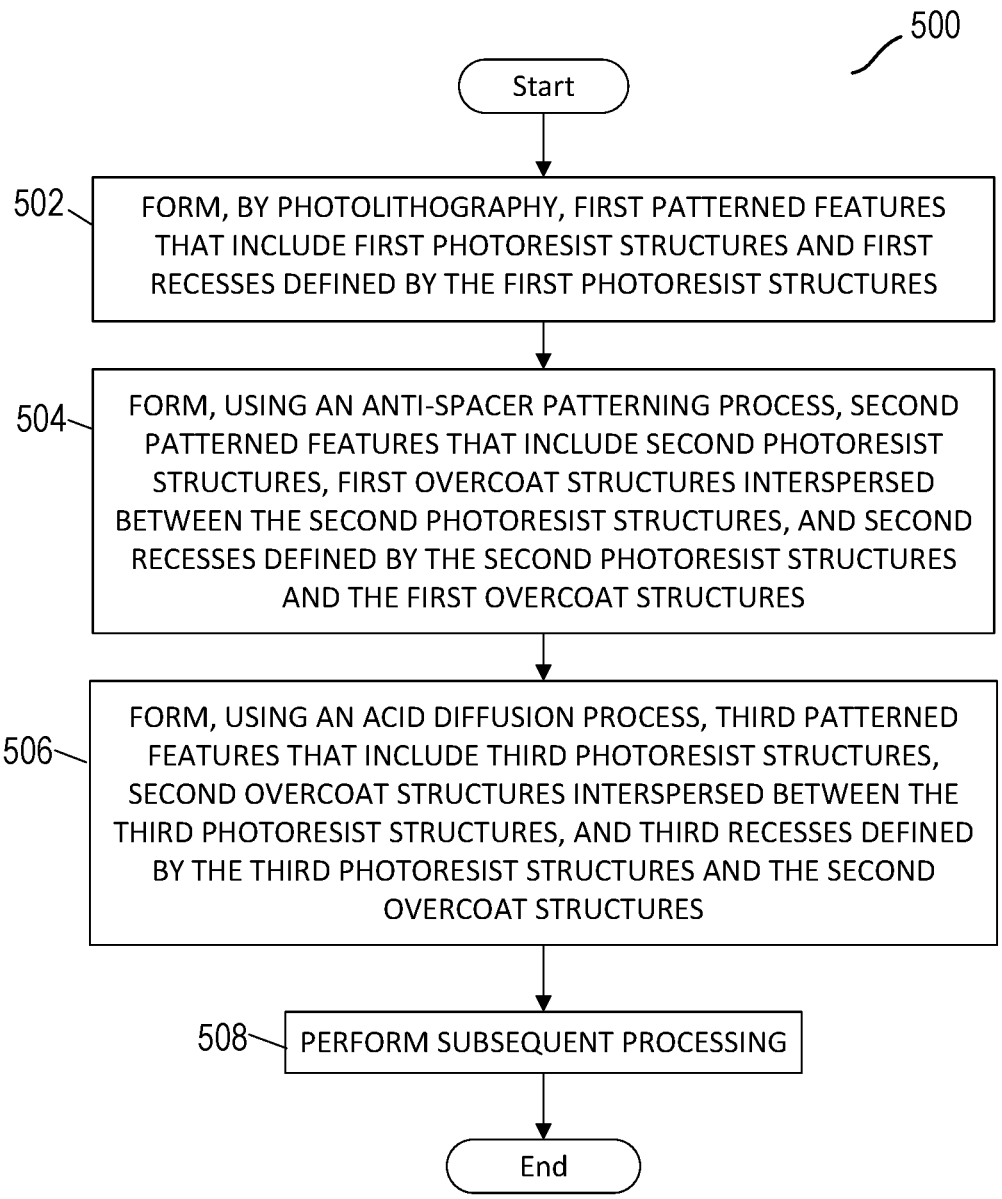
FIG. 5 illustrates an example method for patterning a semiconductor workpiece, according to certain embodiments.

FIG. 5 illustrates an example method 500 for patterning a semiconductor workpiece, according to certain embodiments. Method 500 may be analogous to portions or all of patterning process 102, and for purposes of describing example method 500, reference is made primarily to the reference numerals used in connection with FIGS. 1A-1K. Method 500 also could be used to form a structure similar to semiconductor workpiece 200 of FIG. 2. Furthermore, aspects of at least FIGS. 1A-1K and 2 not described in connection with FIG. 5 are incorporated by reference. Method 500, however, may implement any suitable patterning process.

At step 502, patterned features 108 may be formed on a semiconductor wafer (e.g., semiconductor workpiece 100) by photolithography. Patterned features 108 may include photoresist structures 109 and recesses 110 defined by photoresist structures 109. For example, patterned features 108 may be patterned from a photoresist layer formed on semiconductor workpiece 100.

Photoresist structures 109 may have widths $R_{w1}$. Recesses 110 may have actual widths ($W_a$) that are greater than a target width ($W_t$). The actual widths ($W_a$) may be determined according to a photolithography technology used to form patterned features 108. The actual widths ($W_a$) may exceed the target width ($W_t$) due at least in part to limitations resulting from a wavelength of the photolithography used to for patterned features 108. That is, a minimum achievable width for actual width $W_a$ is determined according to a photolithography technology used for the photolithography.

At step 504, using an anti-spacer patterning process, patterned features 123 may be formed on semiconductor workpiece 100. Patterned features 123 may include photoresist structures 109', overcoat structures 122 interspersed between photoresist structures 109', and recesses 124 defined by photoresist structures 109' and overcoat structures 122. Photoresist structures 109' have a width $R_{w2}$ that is less than the width $R_{w1}$ of photoresist structures 109. Overcoat structures 122 have the actual width $W_a$ of now-filled recesses 110. Recesses 124 have a width ($D_{d1}$ or $D_{d2}$) that is less than the target width ($W_t$). In certain embodiments, the anti-spacer process corresponds to some or all of the steps of patterning process 102 associated with FIGS. 1A-1F, some or all of steps 302 through 312 of method 300 from FIG. 3, or some or all of steps 402-412 of method 400 from FIG. 4.

At step 506, using an acid diffusion process, patterned features 134 may be formed on semiconductor workpiece 100. Patterned features 134 may include photoresist structures 109", overcoat structures 122' interspersed between photoresist structures 109", and recesses 124' defined by photoresist structures 109" and overcoat structures 122'. Photoresist structures 109" may have a width $R_{w2}$, which might be the same or less than the width $R_{w2}$ of photoresist structures 109', depending on whether the acid diffusion process of step 506 further reduces a width of photoresist structures 109' to form photoresist structures 109". Following a width reduction associated with the acid diffusion process of step 506 during which portions of overcoat structures 122 have been selectively removed to form overcoat structures 122', overcoat structures 122' have the target width $W_t$, and recesses 124' have a width ($S_w$), which is greater than a width ($D_{d1}$ or $D_{d2}$) of recesses 124. Width $S_w$ may be the target width ($W_t$).

In certain embodiments, the acid diffusion process (which for purposes of this example may include an associated development process) corresponds to some or all of the steps of patterning process 102 associated with FIGS. 1H-1J, some or all of steps 316 through 320 of method 300 from FIG. 3, or some or all of steps 416-420 of method 400 from FIG. 4. In certain embodiments, prior to or as part of the acid diffusion process of step 506, a solubility-changing process may be executed to cause overcoat structures 122 to become insoluble for development.

At step 508, subsequent processing may be performed. For example, patterned features 134 of semiconductor workpiece 100 may be used to form sub-resolution features in an underlying layer (e.g., intermediate layer 106) of semiconductor workpiece 100.

Method 500 may then end.

Methods 300, 400, and 500 may be combined with each other or other methods and performed using the systems and apparatuses described herein. Although shown in a logical order, the arrangement and numbering of the steps of methods 300, 400, and 500 are not intended to be limited. The steps of methods 300, 400, and 500 may be performed in any suitable order or concurrently with one another as may be apparent to a person of skill in the art.

Figure 7:
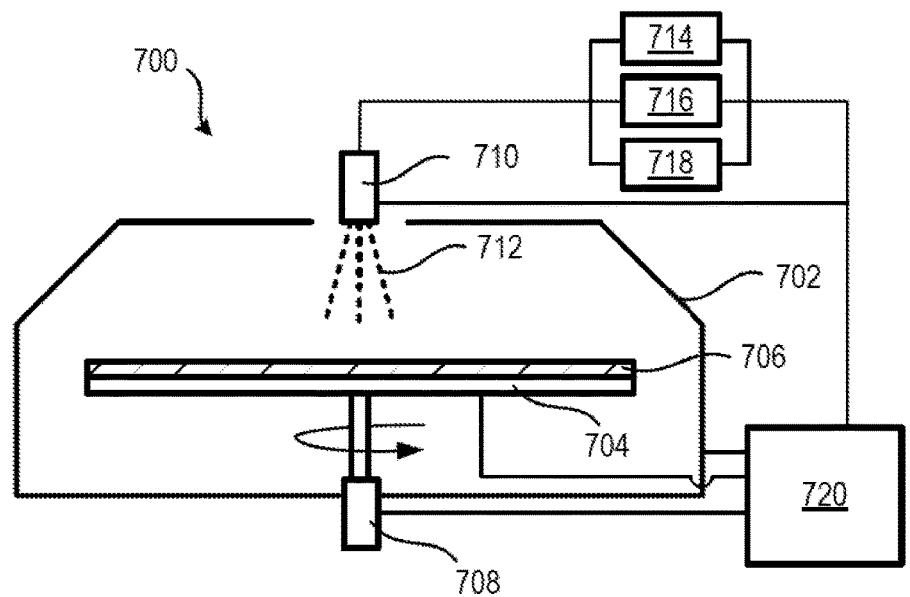
FIG. 7 illustrates an example liquid-based spin-on deposition system, according to certain embodiments.
Figure 6:
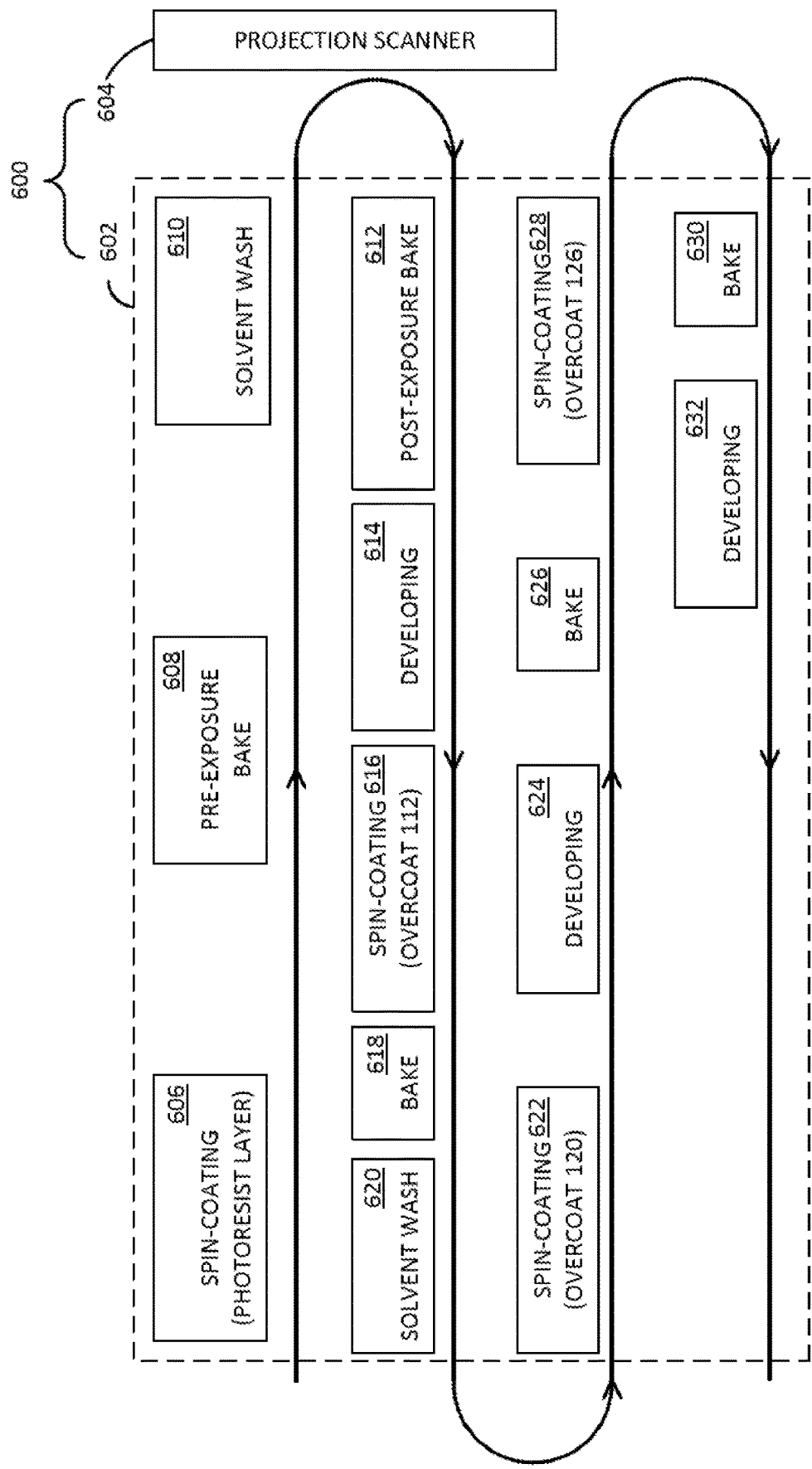
FIG. 6 illustrates a block diagram of an example lithography system, according to certain embodiments.

FIGS. 6-7 illustrate example processing tools that may be used, along or in combination, to implement certain embodiments of this disclosure.

FIG. 6 illustrates a block diagram of an example lithography system 600, according to certain embodiments. Lithography system 600 is just one example of a lithography system that may be used with certain embodiments of this disclosure. In the illustrated example, lithography system 600 includes a track system 602 and a projection scanner 604. In certain embodiments, lithography system 600 is generally configured for performing certain embodiments of patterning process 102 and/or methods 300/400/500.

Scanner 604 may be configured to perform an exposure phase of a photolithography process. In certain embodiments, scanner 604 is a combination of an optical and mechanical system to scan an optical image of a pattern printed on a photomask onto the surface of a wafer (e.g., semiconductor workpiece 100) coated with resist (e.g., a photoresist layer from which photoresist structures 109 are formed). After scanning the pattern once, scanner 604 may be operated to step to an adjacent location on the same wafer where the scan is repeated to form another copy of the pattern. In this manner, the photoresist layer is exposed to multiple copies of the pattern arranged in a rectangular matrix on the surface of the wafer. Scanner 604 may be used as part of the photolithography process to form patterned features 108.

Track system 602 includes a series of process modules assembled to allow potentially sequential execution of processes for the lithography process prior to the exposure and after the exposure step performed by scanner 604. Track system 602 provides the material processes such as coating the wafer with photoresist, baking the photoresist, and developing the photoresist after exposure. In the illustrated example, the process modules of track system 602 include a spin-coating module 606, a pre-exposure bake module 608, a solvent wash module 610, a post-exposure bake module 612, a developing module 614, a spin-coating module 616, a bake module 618, a solvent wash module 620, a spin-coating module 622, a developing module 624, a bake module 626, a spin-coating module 628, a bake module 630, and a developing module 632. These modules may correspond to the steps of patterning process 102 described above with reference to FIGS. 1A-1J and/or method 300/400/500 described above with reference to FIGS. 3-5. Spin-coating modules 606, 616, 622, and 628 include a spin-coater, an example of which is described below with reference to FIG. 7. Photoresist materials, overcoat materials, and solvents are connected from a liquid supply system to suitable processing modules (e.g., spin-coating modules 606, 616, 622, and 628, developing modules 614, 624, and 632, etc.) via pipelines, filters, valves, and pumps.

In addition to process modules, track system 602 could include an imaging module and could also include an inspection and metrology (IM) module, along with any other suitable module. For example, to the extent agent-generating ingredients in the form of PAGs are included in one or more overcoat films, associated irradiation modules (e.g., for exposing a semiconductor workpiece to flood radiation) may be inserted at appropriate locations along the track.

Lithography system 600 may include a transfer system to move a wafer (e.g., a semiconductor workpiece) from module-to-module of track system 602, as well as from track system 602 to projection scanner 604 (which may be considered "off track") and from projection scanner 604 back to track system 602.

FIG. 7 illustrates an example liquid-based spin-on deposition system 700, according to certain embodiments. For example, liquid-based spin-on deposition system 700 may be used to process any of the described semiconductor workpieces to deposit any of the photoresist layers, barrier layers, photoresist formulas, overcoat films or other suitable materials described in this disclosure. In certain embodiments, spin-on deposition system 700 may be a semi-closed spin-on deposition system used for coating substrates (wafers) with a desired layer. The semi-closed configuration may allow fume control and minimize exhaust volume.

In the illustrated example, spin-on deposition system 700 includes a process chamber 702 that includes a substrate holder 704 for supporting, heating, and rotating (spinning) a substrate 706 (which may include any of the semiconductor workpieces described in this disclosure at appropriate stages of processing), a rotating apparatus 708 (e.g., a motor), and a liquid delivery nozzle 710 configured for providing a processing liquid 712 to an upper surface of substrate 706. Liquid supply systems 714, 716, and 718 supply different processing liquids to liquid delivery nozzle 710. For depositing a photoresist, the different processing liquids can include, for example, a first reactant in a first liquid, a second reactant in a second liquid, and a rinsing liquid. In certain embodiments, spin-on deposition system 700 includes additional liquid delivery nozzles for providing different liquids to substrate 706. Example rotating speeds can be between about 500 rpm and about 1500 rpm, for example 1000 rpm, during exposure of an upper surface of substrate 706 to processing liquid 712.

Spin-on deposition system 700 may include a controller 720 that can be coupled to and control process chamber 702; liquid supply systems 714, 716, and 718; liquid delivery nozzle 710; rotating apparatus 708, mechanism for heating substrate holder 704. Substrate 706 may be under an inert atmosphere during film deposition. Spin-on deposition system 700 may be configured to process substrates 706 of any suitable size.

Certain embodiments may provide none, some, or all of the following technical advantages. Other advantages may be described throughout this disclosure or otherwise be apparent from this disclosure to one of skill in the art.

Certain embodiments may allow access to CDs that extend beyond CDs achievable using a particular photolithography technology. Such critical dimensions that exceed a CD that is directly achievable with a particular photolithography technology and its associated wavelength may be referred to as sub-resolution features. For example, certain embodiments of this disclosure may allow 248 nm lithography to access dimensions achievable using 193 nm dry lithography and/or potentially beyond. As another example, certain embodiments of this disclosure may allow 193 nm dry lithography to access dimensions achievable using 193 nm immersion lithography and/or potentially beyond. As another example, certain embodiments of this disclosure may allow 193 immersion lithography to access dimensions achievable using EUV lithography and/or potentially beyond. As another example, certain embodiments of this disclosure may allow 193 nm dry lithography to access dimensions achievable using 193 nm immersion lithography and/or potentially beyond.

Furthermore, in addition to allowing certain sub-resolution feature sizes to be achieved, certain embodiments are able to achieve target pitch ratios, which may increase feature density on a semiconductor workpiece. In certain embodiments, a 1:1:1:1 line-space-line-space pitch ratio may be achieved. Thus, certain embodiments modify an anti-spacer patterning process to allow a narrow pitch density to be achieved that exceeds a pitch density that can be achieved using the photolithography technology being used as part of the anti-spacer process or using the anti-spacer process alone.

Thus, certain embodiments may allow manufacturers (e.g., semiconductor fabricators) to use older and/or less expensive photolithography technologies (e.g., 193 nm dry photolithography) without investing in expensive newer photolithography technology to achieve sub-resolution feature sizes and reduced pitch ratios. Additionally or alternatively, even with expensive newer technology, certain embodiments may allow manufacturers (e.g., semiconductor fabricators) to achieve feature sizes and pitch ratios even beyond those directly achievable with the newer technology. This cost reduction may reduce a barrier to entry into certain node sizes and/or types of semiconductor devices.

Certain embodiments provide a track-based solution that can be incorporated into a photolithography track, which may facilitate process integration.

Certain embodiments provide a time-efficient solution to reducing or minimizing sub-resolution feature pitch ratio. For example, in certain embodiments the diffusion/deprotection process (e.g., to achieve a 45 nm feature size) can be accomplished in two minutes or less, and potential less than ninety seconds, which provides a time-efficient solution, particularly when compared to other possible processes that may involve lengthy layer-growing processes (e.g., at angstroms per minute).

Example embodiments of this disclosure are summarized here. Other embodiments can also be understood from the entirety of the specification as well as the claims filed herein.

Example 1. A method includes depositing a first overcoat film on a semiconductor wafer that includes first patterned features of a photoresist layer, the first patterned features include first photoresist structures and first recesses defined by the first photoresist structures. The first overcoat film fills the first recesses and covers the first photoresist structures. The first recesses have first widths that are greater than a target width. The method includes baking the semiconductor wafer to form soluble portions of the first photoresist structures, selectively removing the first overcoat film, and depositing a second overcoat film that fills the first recesses and covers the first photoresist structures. The method includes developing the semiconductor wafer to remove portions of the second overcoat film to reveal and remove the soluble portions of the first photoresist structures to define second patterned features that include second photoresist structures, first overcoat structures interspersed between the second photoresist structures, and second recesses defined by the second photoresist structures and the first overcoat structures. The method includes executing a solubility-changing process to cause the first overcoat structures to become insoluble for development, depositing a third overcoat film that fills the second recesses and covers the second photoresist structures and the first overcoat structures, and baking the semiconductor wafer to form soluble portions of the first overcoat structures. The method includes developing the semiconductor wafer to remove the third overcoat film and the soluble portions of the first overcoat structures to define third patterned features that include third photoresist structures, second overcoat structures interspersed between the third photoresist structures, and third recesses defined by the second overcoat structures and the third photoresist structures. The second overcoat structures have the target width.

Example 2. The method of Example 1, where baking the semiconductor wafer to form soluble portions of the first photoresist structures includes a solubility-changing agent diffusing, in response to heat associated with baking the semiconductor wafer, from the first overcoat film to perimeter portions of the first photoresist structures, the solubility-changing agent modifying the perimeter portions of the first photoresist structures to become soluble for development, thereby forming the soluble portions of the first photoresist structures.

Example 3. The method of any one of Examples 1-2, where the solubility-changing agent includes acid and the first photoresist structures include an acid-reactive material.

Example 4. The method of any one of Examples 1-3, where the first overcoat film includes a polymer and an agent-generating ingredient for generating the solubility-changing agent, the agent-generating ingredient including a TAG or a PAG.

Example 5. The method of any one of Examples 1-4, where the agent-generating ingredient includes a PAG and the method further includes exposing, prior to baking the semiconductor wafer to form soluble portions of the first photoresist structures, the first overcoat film to actinic radiation to cause the PAG in the first overcoat film to generate the solubility-changing agent.

Example 6. The method of any one of Examples 1-5, where baking the semiconductor wafer to form the soluble portions of the first photoresist structures causes the solubility-changing agent to diffuse from the first overcoat film to the perimeter portions of the first photoresist structures up to a target depth, the target depth being less than or equal to one half of a difference between the first width and the target width.

Example 7. The method of any one of Examples 1-6, where the target depth is equal to one half of a difference between the first width and the target width, and where a width of the second photoresist structures equals a width of the third photoresist structures.

Example 8. The method of any one of Examples 1-6, where: the target depth is less than one half of a difference between the first width and the target width; baking the semiconductor wafer to form the soluble portions of the first overcoat structures further forms soluble portions of the second photoresist structures; developing the semiconductor wafer to remove the third overcoat film and the soluble portions of the first overcoat structures further removes the soluble portions of the second photoresist structures to define the third photoresist structures; and a width of the third photoresist structures is less than a width of the second photoresist structures.

Example 9. The method of any one of Examples 1-8, where: executing the solubility-changing process to cause the first overcoat structures to become insoluble for development includes baking the semiconductor wafer; and a temperature for baking the semiconductor wafer to cause the first overcoat structures to become insoluble for development is greater than a temperature for baking the semiconductor wafer to form the soluble portions of the first photoresist structures.

Example 10. The method of any one of Examples 1-9, where, prior to executing the solubility-changing process to cause the first overcoat structures to become insoluble for development, the second overcoat film is soluble at a first removal rate in a developer used for developing the semiconductor wafer to remove the portions of the second overcoat film to reveal and remove the soluble portions of the first photoresist structures, the soluble portions of the first photoresist structures being soluble at a second removal rate in the developer, the second removal rate being greater than the first removal rate.

Example 11. The method of any one of Examples 1-10, where executing the solubility-changing process to cause the first overcoat structures to become insoluble for development includes exposing the first overcoat structures to actinic radiation.

Example 12. The method of any one of Examples 1-11, where the second overcoat film includes a polymer and the solubility-changing process causes polymer crosslinking to occur in the second overcoat structures, the polymer crosslinking rendering the second overcoat structures insoluble in a developer for developing the semiconductor wafer to remove the third overcoat film and the soluble portions of the first overcoat structures.

Example 13. The method of any one of Examples 1-12, where baking, subsequent to the polymer crosslinking, the semiconductor wafer to form the soluble portions of the first overcoat structures causes perimeter portions to a target depth of the first overcoat structures to become soluble for development in a developer for developing the semiconductor wafer to remove the third overcoat film and the soluble portions of the first overcoat structures.

Example 14. The method of any one of Examples 1-13, where baking the semiconductor wafer to form soluble portions of the first overcoat structures includes a solubility-changing agent diffusing, in response to heat associated with baking the semiconductor wafer, from the third overcoat film to perimeter portions of the first overcoat structures, the solubility-changing agent modifying the perimeter portions of the first overcoat structures to become soluble for development, thereby forming the soluble portions of the first overcoat structures.

Example 15. The method of any one of Examples 1-14, where the solubility-changing agent includes acid and the first overcoat structures include an acid-reactive material.

Example 16. The method of any one of Examples 1-15, where the third overcoat film includes a polymer and an agent-generating ingredient for generating the solubility-changing agent, the agent-generating ingredient including a TAG or a PAG.

Example 17. The method of any one of Examples 1-16, where the agent-generating ingredient includes a PAG and the method further includes exposing, prior to baking the semiconductor wafer to form soluble portions of the first overcoat structures, the third overcoat film to actinic radiation to cause the photoacid generator in the third overcoat film to generate the solubility-changing agent.

Example 18. The method of any one of Examples 1-17, where baking the semiconductor wafer to form the soluble portions of the first overcoat structures causes the solubility-changing agent to diffuse from the third overcoat film to the perimeter portions of the first overcoat structures up to a target depth, the target depth being less than or equal to one half of a difference between the first width and the target width.

Example 19. The method of any one of Examples 1-18, where: the target depth is less than one half of a difference between the first width and the target width; baking the semiconductor wafer to form the soluble portions of the first overcoat structures further forms soluble portions of the second photoresist structures; developing the semiconductor wafer to remove the third overcoat film and the soluble portions of the first overcoat structures further removes the soluble portions of the second photoresist structures to define the third photoresist structures; and a width of the third photoresist structures is less than a width of the second photoresist structures.

Example 20. The method of any one of Examples 1-19, where: baking the semiconductor wafer to form the soluble portions of the first overcoat structures diffuses a first solubility-changing agent of the third overcoat film into the second photoresist structures to form soluble portions of the second photoresist structures; and developing the semiconductor wafer to remove the third overcoat film and the soluble portions of the first overcoat structures further removes the soluble portions of the first photoresist structures to define the third photoresist structures.

Example 21. The method of any one of Examples 1-20, where: the first widths exceed the target width by an overage amount; baking the semiconductor wafer to form the soluble portions of the first photoresist structures causes a second solubility-changing agent to diffuse from the first overcoat film to perimeter portions of the first photoresist structures up to a first diffusion depth; baking the semiconductor wafer to form the soluble portions of the first overcoat structures diffuses the first solubility-changing agent of the third overcoat film into perimeter portions of the first overcoat structures by a second diffusion depth; baking the semiconductor wafer to form the soluble portions of the first overcoat structures further diffuses the first solubility-changing agent of the third overcoat film to perimeter portions of the second photoresist structures up to a third diffusion depth to form the soluble portions of the second photoresist structures; and the first diffusion depth equals the target width minus half the overage amount plus a total of the second diffusion depth and the third diffusion depth.

Example 22. The method of any one of Examples 1-21, where: the first widths exceed the target width by an overage amount; baking the semiconductor wafer to form the soluble portions of the first photoresist structures causes a solubility-changing agent to diffuse from the first overcoat film to perimeter portions of the first photoresist structures up to a first diffusion depth; the second photoresist structures and the third photoresist structures have a same width; and the first diffusion depth equals the target width minus half the overage amount.

Example 23. The method of any one of Examples 1-23, further including forming the first patterned features on the semiconductor wafer, where forming the first patterned features includes: depositing the photoresist layer on a semiconductor wafer to be patterned by photolithography; exposing the photoresist layer to a pattern of actinic radiation; and developing the photoresist layer, remaining portions of the photoresist layer forming the first photoresist structures and defining the first recesses.

Example 24. The method of any one of Examples 1-23, where the first widths are determined according to a photolithography technology used to form the first patterned features, and where the target width is less than the first widths.

Example 25. The method of any one of Examples 1-24, where widths of the third patterned features are equal and below a resolution capability of a photolithography technology used to form the first patterned features.

Example 26. The method of any one of Examples 1-25, where one or more of a photoresist layer from which the first photoresist structures are formed, the first overcoat film, the second overcoat film, or the third overcoat film are deposited by spin-coating.

Example 27. The method of any one of Examples 1-26, further including using the third patterned features to form sub-resolution features in an underlying layer of the semiconductor wafer.

Example 28. A method includes forming, on a semiconductor wafer by photolithography, first photoresist structures having a first width and first recesses defined by the first photoresist structures and having a second width less than the first width and greater than a target width. The method includes depositing a first overcoat film; forming, using the first overcoat film, soluble portions of the first photoresist structures; selectively removing the first overcoat film; and depositing a second overcoat film. The method includes removing portions of the second overcoat film and the soluble portions of the first photoresist structures to define second photoresist structures having a third width less than the first width, first overcoat structures of the second overcoat film, and second recesses in regions previously occupied by the soluble portions of the first photoresist structures. The first overcoat structures have the second width, and the second recesses have a fourth width less than the target width. The method includes modifying the first overcoat structures to become insoluble for development; depositing a third overcoat film; forming, using the third overcoat film, soluble portions of the first overcoat structures; and selectively removing the third overcoat film and the soluble portions of the first overcoat structures to define third photoresist structures having a fifth width, second overcoat structures interspersed between the third photoresist structures and having a sixth width equal to the target width, and third recesses defined by the third photoresist structures and the second overcoat structures and having a seventh width greater than the fourth width.

Example 29. The method of Example 28, where the fifth width equals the third width, and where a lateral depth of the soluble portions of the first photoresist structures equals one half a difference between the first width and the third width.

Example 30. The method of Example 28, where the fifth width is less than the third width, and where the method further includes: forming, using the third overcoat film, soluble portions of the second photoresist structures; and selectively removing, when selectively removing the third overcoat film and the soluble portions of the first overcoat structures, the soluble portions of the second photoresist structures to define the third photoresist structures.

Example 31. The method of any one of Examples 28-30, where the seventh width equals the target width.

Example 32. The method of any one of Examples 28-31, where the fifth width equals the target width.

Example 33. The method of any one of Examples 28-32, where the fifth, sixth, and seventh widths equal the target width and define a 1:1:1:1 line-space-line-space pitch ratio.

Example 34. The method of any one of Examples 28-33, where the second overcoat film includes a polymer resin and modifying the first overcoat structures to become insoluble for development includes causing, in response to an activation trigger, a polymer crosslinking reaction to occur in the second overcoat film that renders the first overcoat film insoluble for development in a developer used for selectively removing the third overcoat film and the soluble portions of the first overcoat structures.

Example 35. The method of any one of Examples 28-34, where the activation trigger includes heating the semiconductor wafer or exposing the second overcoat film to actinic radiation.

Example 36. The method of any one of Examples 28-35, where a lateral depth of the soluble portions of the first overcoat structures equals one half a difference between the target width and the second width.

Example 37. The method of any one of Examples 28-36, where: a minimum achievable width for the second width is determined according to a photolithography technology used for the photolithography; and the target width is less than the minimum achievable width.

Example 38. A method includes forming, by photolithography on a semiconductor wafer, first patterned features including first photoresist structures having a first width and first recesses defined by the first photoresist structures and having a second width less than the first width and greater than a target width. The method includes forming, using an anti-spacer patterning process, second patterned features including second photoresist structures having a third width less than the first width, first overcoat structures interspersed between the second photoresist structures and having the second width, and second recesses defined by the second photoresist structures and the first overcoat structures and having a fourth width less than the target width. The method includes forming, using an acid diffusion process, third patterned features that include third photoresist structures having a fifth width, second overcoat structures interspersed between the third photoresist structures and having the target width, and third recesses defined by the third photoresist structures and the second overcoat structures and having a sixth width greater than the fourth width, portions of the first overcoat structures having been selectively removed using the acid diffusion process to form the second overcoat structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

"Substrate," "target substrate," "structure," or "device" as used herein generically refers to an object being processed in accordance with the disclosure, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Although this disclosure describes particular process steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method, comprising:
depositing a first overcoat film on a semiconductor wafer, the semiconductor wafer comprising first patterned features of a photoresist layer, the first patterned features comprising first photoresist structures and first recesses defined by the first photoresist structures, the first overcoat film filling the first recesses and covering the first photoresist structures, the first recesses having first widths that are greater than a target width;
baking the semiconductor wafer to form soluble portions of the first photoresist structures;
selectively removing the first overcoat film;
depositing a second overcoat film that fills the first recesses and covers the first photoresist structures;
developing the semiconductor wafer to remove portions of the second overcoat film to reveal and remove the soluble portions of the first photoresist structures to define second patterned features that comprise second photoresist structures, first overcoat structures interspersed between the second photoresist structures, and second recesses defined by the second photoresist structures and the first overcoat structures;

executing a solubility-changing process to cause the first overcoat structures to become insoluble for development;

depositing a third overcoat film that fills the second recesses and covers the second photoresist structures and the first overcoat structures;

baking the semiconductor wafer to form soluble portions of the first overcoat structures; and developing the semiconductor wafer to remove the third overcoat film and the soluble portions of the first overcoat structures to define third patterned features that comprise third photoresist structures, second overcoat structures interspersed between the third photoresist structures, and third recesses defined by the second overcoat structures and the third photoresist structures, wherein the second overcoat structures have the target width.

2. The method of claim 1, wherein baking the semiconductor wafer to form soluble portions of the first photoresist structures comprises a solubility-changing agent diffusing, in response to heat associated with baking the semiconductor wafer, from the first overcoat film to perimeter portions of the first photoresist structures up to a target depth, the solubility-changing agent modifying the perimeter portions of the first photoresist structures to become soluble for development, thereby forming the soluble portions of the first photoresist structures, the target depth being less than or equal to one half of a difference between the first width and the target width.

3. The method of claim 2, wherein:
the solubility-changing agent comprises acid;
the first photoresist structures comprise an acid-reactive material and
the first overcoat film comprises:
  a polymer; and
  an agent-generating ingredient for generating the solubility-changing agent, the agent-generating ingredient comprising a thermal-acid generator or a photoacid generator.

4. The method of claim 1, wherein:
executing the solubility-changing process to cause the first overcoat structures to become insoluble for development comprises baking the semiconductor wafer; and
a temperature for baking the semiconductor wafer to cause the first overcoat structures to become insoluble for development is greater than a temperature for baking the semiconductor wafer to form the soluble portions of the first photoresist structures.

5. The method of claim 1, wherein:
the second overcoat film comprises a polymer; and
the solubility-changing process causes polymer crosslinking to occur in the second overcoat structures, the polymer crosslinking rendering the second overcoat structures insoluble in a developer for developing the semiconductor wafer to remove the third overcoat film and the soluble portions of the first overcoat structures.

6. The method of claim 1, wherein baking the semiconductor wafer to form soluble portions of the first overcoat structures comprises a solubility-changing agent diffusing, in response to heat associated with baking the semiconductor wafer, from the third overcoat film to perimeter portions of the first overcoat structures up to a target depth, the solubility-changing agent modifying the perimeter portions of the first overcoat structures to become soluble for development, thereby forming the soluble portions of the first overcoat structures, the target depth being less than or equal to one half of a difference between the first width and the target width.

7. The method of claim 6, wherein:
the solubility-changing agent comprises acid; and
the first overcoat structures comprise an acid-reactive material
the third overcoat film comprises:
  a polymer; and
  an agent-generating ingredient for generating the solubility-changing agent, the agent-generating ingredient comprising a thermal-acid generator or a photoacid generator.

8. The method of claim 1, wherein:
baking the semiconductor wafer to form the soluble portions of the first overcoat structures diffuses a first solubility-changing agent of the third overcoat film into the second photoresist structures to form soluble portions of the second photoresist structures; and
developing the semiconductor wafer to remove the third overcoat film and the soluble portions of the first overcoat structures further removes the soluble portions of the first photoresist structures to define the third photoresist structures.

9. The method of claim 8, wherein:
the first widths exceed the target width by an overage amount;
baking the semiconductor wafer to form the soluble portions of the first photoresist structures causes a second solubility-changing agent to diffuse from the first overcoat film to perimeter portions of the first photoresist structures up to a first diffusion depth;
baking the semiconductor wafer to form the soluble portions of the first overcoat structures diffuses the first solubility-changing agent of the third overcoat film into perimeter portions of the first overcoat structures by a second diffusion depth;
baking the semiconductor wafer to form the soluble portions of the first overcoat structures further diffuses the first solubility-changing agent of the third overcoat film to perimeter portions of the second photoresist structures up to a third diffusion depth to form the soluble portions of the second photoresist structures; and
the first diffusion depth equals the target width minus half the overage amount plus a total of the second diffusion depth and the third diffusion depth.

10. The method of claim 1, wherein:
the first widths exceed the target width by an overage amount;
baking the semiconductor wafer to form the soluble portions of the first photoresist structures causes a solubility-changing agent to diffuse from the first overcoat film to perimeter portions of the first photoresist structures up to a first diffusion depth;
the second photoresist structures and the third photoresist structures have a same width; and
the first diffusion depth equals the target width minus half the overage amount.

11. The method of claim 1, further comprising forming the first patterned features on the semiconductor wafer using a photolithography technology, wherein:

the first widths are determined according to a photolithography technology used to form the first patterned features; and the target width is less than the first widths.

12. The method of claim 1, wherein widths of the third patterned features are equal and are below a resolution capability of a photolithography technology used to form the first patterned features.

13. The method of claim 1, further comprising using the third patterned features to form sub-resolution features in an underlying layer of the semiconductor wafer.

14. A method, comprising:
forming, on a semiconductor wafer by photolithography, first photoresist structures having a first width and first recesses defined by the first photoresist structures and having a second width less than the first width and greater than a target width;
depositing a first overcoat film;
forming, using the first overcoat film, soluble portions of the first photoresist structures;
selectively removing the first overcoat film;
depositing a second overcoat film;
removing portions of the second overcoat film and the soluble portions of the first photoresist structures to define second photoresist structures, first overcoat structures of the second overcoat film, and second recesses in regions previously occupied by the soluble portions of the first photoresist structures, the second photoresist structures having a third width less than the first width, the first overcoat structures having the second width, the second recesses having a fourth width less than the target width;
modifying the first overcoat structures to become insoluble for development;
depositing a third overcoat film;
forming, using the third overcoat film, soluble portions of the first overcoat structures; and
selectively removing the third overcoat film and the soluble portions of the first overcoat structures to define third photoresist structures having a fifth width, second overcoat structures interspersed between the third photoresist structures and having a sixth width equal to the target width, and third recesses defined by the third photoresist structures and the second overcoat structures and having a seventh width greater than the fourth width.

15. The method of claim 14, wherein:
the fifth width equals the third width; and
a lateral depth of the soluble portions of the first photoresist structures equals one half a difference between the first width and the third width.

16. The method of claim 14, wherein:
the fifth width is less than the third width; and
the method further comprises:
forming, using the third overcoat film, soluble portions of the second photoresist structures; and
selectively removing, when selectively removing the third overcoat film and the soluble portions of the first overcoat structures, the soluble portions of the second photoresist structures to define the third photoresist structures.

17. The method of claim 14, wherein the fifth width, the sixth width, and the seventh width equal the target width and define a 1:1:1:1 line-space-line-space pitch ratio.

18. The method of claim 14, wherein:
the second overcoat film comprises a polymer resin; and
modifying the first overcoat structures to become insoluble for development comprises causing, in response to an activation trigger, a polymer crosslinking reaction to occur in the second overcoat film that renders the first overcoat film insoluble for development in a developer used for selectively removing the third overcoat film and the soluble portions of the first overcoat structures.

19. The method of claim 14, wherein a lateral depth of the soluble portions of the first overcoat structures equals one half a difference between the target width and the second width.

20. The method of claim 14, wherein:
a minimum achievable width for the second width is determined according to a photolithography technology used for the photolithography; and
the target width is less than the minimum achievable width.

21. A method, comprising:
forming, by photolithography, first patterned features on a semiconductor wafer, the first patterned features comprising first photoresist structures having a first width and first recesses defined by the first photoresist structures and having a second width less than the first width and greater than a target width;
forming, using an anti-spacer patterning process, second patterned features on the semiconductor wafer, the second patterned features comprising second photoresist structures having a third width less than the first width, first overcoat structures interspersed between the second photoresist structures, and second recesses defined by the second photoresist structures and the first overcoat structures, the first overcoat structures having the second width, the second recesses having a fourth width less than the target width; and
forming, using an acid diffusion process, third patterned features on the semiconductor wafer, the third patterned features comprising third photoresist structures having a fifth width, second overcoat structures interspersed between the third photoresist structures and having the target width, and third recesses defined by the third photoresist structures and the second overcoat structures, portions of the first overcoat structures having been selectively removed using the acid diffusion process to form the second overcoat structures, the third recesses having a sixth width greater than the fourth width.

* * * * *